United States Patent
Chen et al.

(10) Patent No.: US 8,186,634 B2
(45) Date of Patent: May 29, 2012

(54) CABLE MANAGEMENT ARM SUPPORTING DEVICE

(75) Inventors: Ken-Ching Chen, Kaohsiung Hsien (TW); Shun-Ho Yang, Kaohsiung Hsien (TW); Wei-Sheng Wang, Kaohsiung Hsien (TW); Chun-Chiang Wang, Kaohsiung Hsien (TW)

(73) Assignee: King Slide Works Co., Ltd., Kaohsiung Hsien (TW)

( * ) Notice: Subject to any disclaimer, the term of this patent is extended or adjusted under 35 U.S.C. 154(b) by 573 days.

(21) Appl. No.: 12/230,646

(22) Filed: Sep. 3, 2008

(65) Prior Publication Data

US 2009/0065658 A1    Mar. 12, 2009

(30) Foreign Application Priority Data

Sep. 6, 2007   (TW) ................ 96133338 A

(51) Int. Cl.
*F16L 3/08*    (2006.01)

(52) U.S. Cl. ... 248/70; 248/68.1; 248/298.1; 312/334.5; 312/273

(58) Field of Classification Search ............ 248/56, 248/70, 68.1, 27.1, 27.3, 298.1; 361/825, 361/826, 827, 724, 725, 726, 727; 211/26; 312/334.4, 334.5, 273
See application file for complete search history.

(56) References Cited

U.S. PATENT DOCUMENTS

| | | | |
|---|---|---|---|
| 6,600,665 B2 * | 7/2003 | Lauchner | 361/826 |
| 7,654,398 B2 * | 2/2010 | Bridges et al. | 211/26 |
| 2004/0079711 A1 * | 4/2004 | Hartman et al. | 211/26 |
| 2005/0145582 A1 | 7/2005 | Dubon et al. | |
| 2006/0081735 A1 | 4/2006 | Chen et al. | |
| 2006/0081736 A1 | 4/2006 | Chen et al. | |
| 2006/0113433 A1 | 6/2006 | Chen et al. | |
| 2007/0114895 A1 * | 5/2007 | Chen et al. | 312/333 |
| 2009/0014601 A1 * | 1/2009 | Chen et al. | 248/70 |

* cited by examiner

Primary Examiner — Terrell McKinnon
Assistant Examiner — Eret McNichols
(74) Attorney, Agent, or Firm — Rosenberg, Klein & Lee

(57) ABSTRACT

A cable management arm supporting device includes an extendable supporting frame which has a first and second frames, a fixing member and a coupling member. The first frame has a pivotal portion and a casing portion. The second frame has an inserting portion and a fixing portion. The inserting portion is connected to the casing portion. The pivotal portion is connected to the coupling member. The fixing portion is connected to the fixing member. The fixing member is connected with a fixed object. The coupling member is selectively connected to either a movable loading object, a sliding member, or a cable management arm. Thereby, the cable management arm extends along with the movement of the loading object or the sliding member so that one end of the supporting frame is extendable and the weight of the cable management arm is carried by the supporting frame.

19 Claims, 26 Drawing Sheets

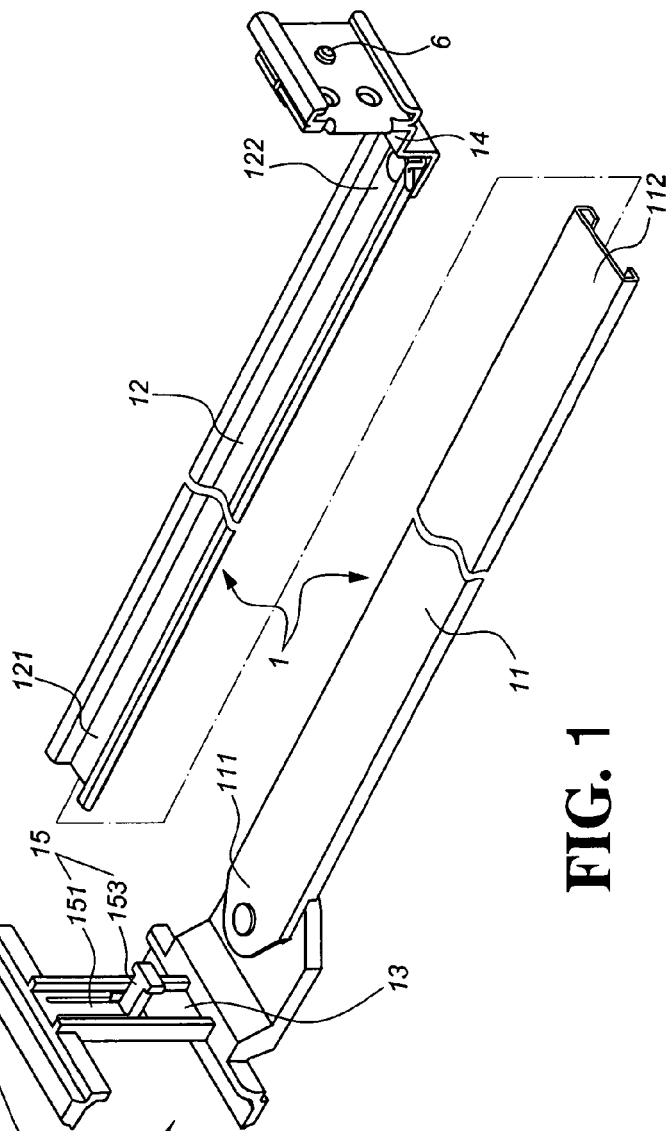
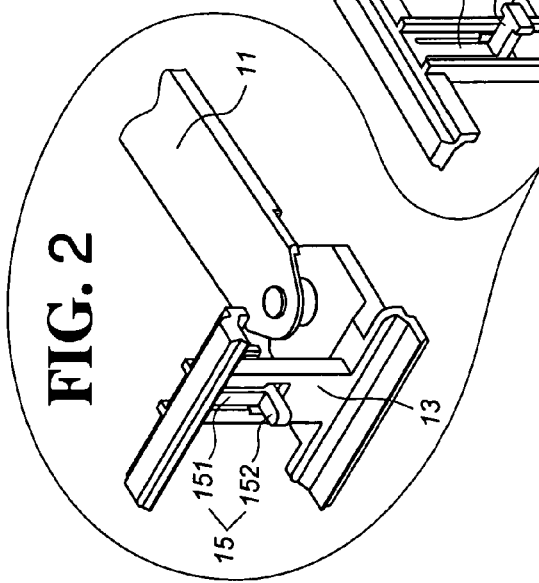

US 8,186,634 B2

CABLE MANAGEMENT ARM SUPPORTING DEVICE

BACKGROUND OF THE INVENTION

1. Field of the Invention

The present invention relates to a cable management arm supporting device, and more particularly to an extendable supporting frame having one end fixed and another end extendable so that the supporting frame is able to carry the weight of a cable management arm.

2. Description of the Prior Art

In general, most electronic products are carried by a sliding member (such as a sliding rail) and stored in a closet. The electronic products always have many wires at the rear end thereof. In order to prevent those wires from dropping to affect other products placed underneath, a cable management arm is provided to accommodate the wires.

A conventional cable management arm is connected to an installed apparatus or incorporated with a sliding member. The cable management arm has a main frame composed of two sections connected to each other. The frame has one end and another end as a supporting point. Upon the frame is collapsed, the cable management arm has its outer connecting end located away from the supporting point in a suspension status. However, due to the weight of the wires and the cable management arm, the collapsed cable management arm somewhat drops, which may influence the operation of each electronic product.

Another conventional cable management arm is provided with a loading board secured to the underneath of the cable management arm. However, the loading board is unable to support the cable management arm when the cable management arm is extended along with a loading object and the sliding member.

Taiwanese patent publication Nos. I249605 (US early publication Nos. 2006/0081735 A1 and 2006/0081736 A1) and I276276 (US early publication No. 2006/0113433 A1) disclosed a cable management arm incorporated with a slide assembly, which enables the cable management arm to extend and still has the support to prevent the cable management arm from dropping.

SUMMARY OF THE INVENTION

The present invention relates to a cable management arm supporting device to prevent it from dropping or falling, and also to facilitate the installation.

In a first aspect of the present invention, there is provided a cable management arm supporting device comprising:

a first frame having a pivotal portion and a casing portion at respective ends thereof;

a second frame having an inserting portion and a fixing portion at respective ends thereof, the inserting portion of the second frame being inserted into the casing portion of the first frame;

a coupling member connected to the pivotal portion of the first frame;

a sliding member comprising a traveling rail, a fixing rail, and a connecting portion; and a fixing member connected to the fixing portion of the second frame and to the connecting portion, respectively.

Preferably, the fixing member further comprises a fastening unit to be secured to the sliding member.

Preferably, the fastening unit comprises a base, a resilient seat, and a latch, the base having an accommodating room, an open groove, and a through hole, the resilient seat being inserted into the accommodating room, the latch having a front section inserting through the open groove, a middle section passing the resilient seat and a rear section inserting into the through hole, the resilient seat having a resilient leg and an engaging projection, the latch having a stress portion to hold against the resilient leg, the engaging projection engaging with the base, the base further having a holding portion.

Preferably, the connecting portion is provided on one end of the fixing rail.

Preferably, the fixing rail of the sliding member is connected with a bracket, the connecting portion being provided on one end of the bracket.

Preferably, the cable management arm supporting device further comprises a plurality of fixing posts, the fixing member further comprising a fastening unit to be secured to the fixing posts.

Preferably, the coupling member is connected to the traveling rail of the sliding member.

Preferably, the cable management arm supporting device further comprises a loading object connected to the sliding member, and the coupling member being connected to the loading object.

Preferably, the first frame and the second frame have a restricting groove and a protuberance corresponding to each other, the protuberance being confined to slide within the restricting groove.

Preferably, the coupling member further comprises a coupling portion, the coupling portion having an engaging section, the sliding member comprising an actuating portion, the actuating portion activating the engaging section to release the coupling portion from a synchronal action.

Preferably, the coupling member is disposed in the fixing rail of the sliding member to slide.

Preferably, the sliding member comprises a fixing rail, an extension rail, and a traveling rail, the coupling member is disposed in the extension rail of the sliding member to slide.

Preferably, the coupling member is disposed in the fixing rail of the sliding member and further comprises a coupling portion connected to the extension rail to slide synchronously.

Preferably, the coupling member is direct connected to the extension rail to slide.

In a second aspect of the present invention, there is provided a cable management arm supporting device comprising a plurality of fixing posts and at least a pair of sliding members secured to the fixing posts, respectively, each the sliding member comprising a fixing rail and a traveling rail, the traveling rail carrying a loading object, the device further comprising:

a supporting frame comprising a first frame, a second frame, a coupling member, and a fixing member, the first frame having a pivotal portion and a casing portion at respective ends thereof, the second frame having an inserting portion and a fixing portion at respective ends thereof, the inserting portion of the second frame being inserted into the casing portion of the first frame, the pivotal portion of the first frame being connected to the coupling member, the fixing portion of the second frame being connected to the fixing member; wherein the fixing member being selectively connected to either the fixing rail or the fixing posts; and wherein the coupling member being selectively connected to either the traveling rail or the loading object.

Preferably, the fixing rail is connected with a bracket, the bracket being connected to the fixing member.

In a third aspect of the present invention, there is provided a cable management arm supporting device comprising an extendable supporting frame, a sliding member and a foldable cable management arm;

wherein the supporting frame comprising at least a first frame and a second frame which are extendable with each other, a coupling member, and a fixing member, the first frame having a pivotal portion and a casing portion at respective ends thereof, the second frame having an inserting portion and a fixing portion at respective ends thereof, the inserting portion of the second frame being inserted into the casing portion of the first frame, the pivotal portion of the first frame being connected to the coupling member, the fixing portion of the second frame being connected to the fixing member, the fixing member of the supporting frame being connected to a fixed object of an installed equipment, when a loading object carried by the sliding member on the installed equipment moves, the coupling member of the supporting frame being linked to move and the supporting frame extending and holding against the cable management arm.

Preferably, the cable management arm comprises a first arm, a second arm, a movable portion, and a fixed portion, one end of the first arm being pivotally connected to one end of the second arm, another end of the first arm being connected to the movable portion, another end of the second arm being connected to the fixed portion, the cable management arm further comprising a restricting member located between the movable portion and the fixed portion relative to the supporting frame.

Preferably, a first shift member is pivoted between the first arm and the movable portion of the cable management arm, and a second shift member is pivoted between the second arm and the fixed portion.

Preferably, an intermediate shelf is pivoted between the first arm and the second arm of the cable management arm.

Preferably, the intermediate shelf is provided with a restricting member, the restricting member holding against the supporting frame to secure the cable management arm in place.

It is the primary object of the present invention to provide a cable management arm supporting device, which provides a good support to the cable management arm.

It is another object of the present invention to provide a cable management arm supporting device, which provides a selective connection by the supporting frame having one end fixed and another end extendable.

BRIEF DESCRIPTION OF THE DRAWINGS

FIG. 1 is an exploded view of a supporting frame in the type of two sections according to a preferred embodiment of the present invention;

FIG. 2 is a perspective view showing a coupling member and a coupling portion according to the preferred embodiment of the present invention;

DETAILED DESCRIPTION OF THE PREFERRED EMBODIMENTS

Figure 3:
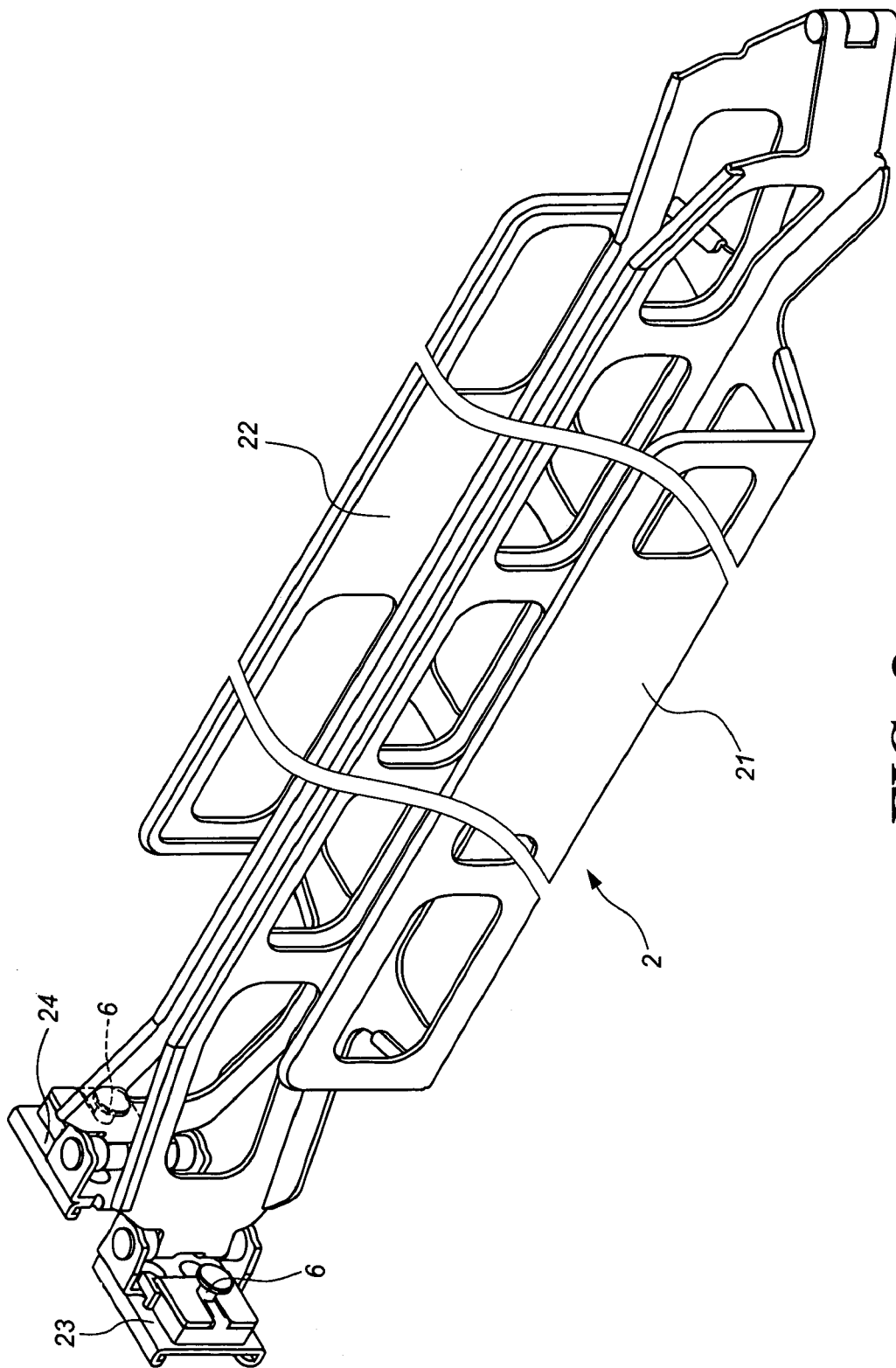
FIG. 3 is a perspective view showing a cable management arm with less joints according to the preferred embodiment of the present invention.

As shown in FIG. 1, a supporting frame 1 according to a preferred embodiment of the present invention comprises a first frame 11, a second frame 12, a coupling member 13, and a fixing member 14. The first frame 11 has a pivotal portion 111 and a casing portion 112 at respective ends thereof. The second frame 12 has an inserting portion 121 and a fixing portion 122 at respective ends thereof. The inserting portion 121 of the second frame 12 is inserted into the casing portion 112 of the first frame 11. The pivotal portion 111 is connected to the coupling member 13. The fixing portion 122 of the second frame 12 is connected to the fixing member 14. As shown in FIG. 1, the coupling member 13 is in the form of a sliding base to carry a loading object and to slide freely (please refer to the description regarding FIGS. 13 through 16 hereinafter). The coupling member 13 further comprises a coupling portion 15. In a preferred embodiment, as shown in FIG. 2, the coupling portion 15 is an engaging section 152 provided on a resilient rod 152. The resilient rod 152 has a handle 153 for pulling the engaging section 152 away from its original position. Further, the fixing member 14 comprises a fastening unit 6.

Figure 4:
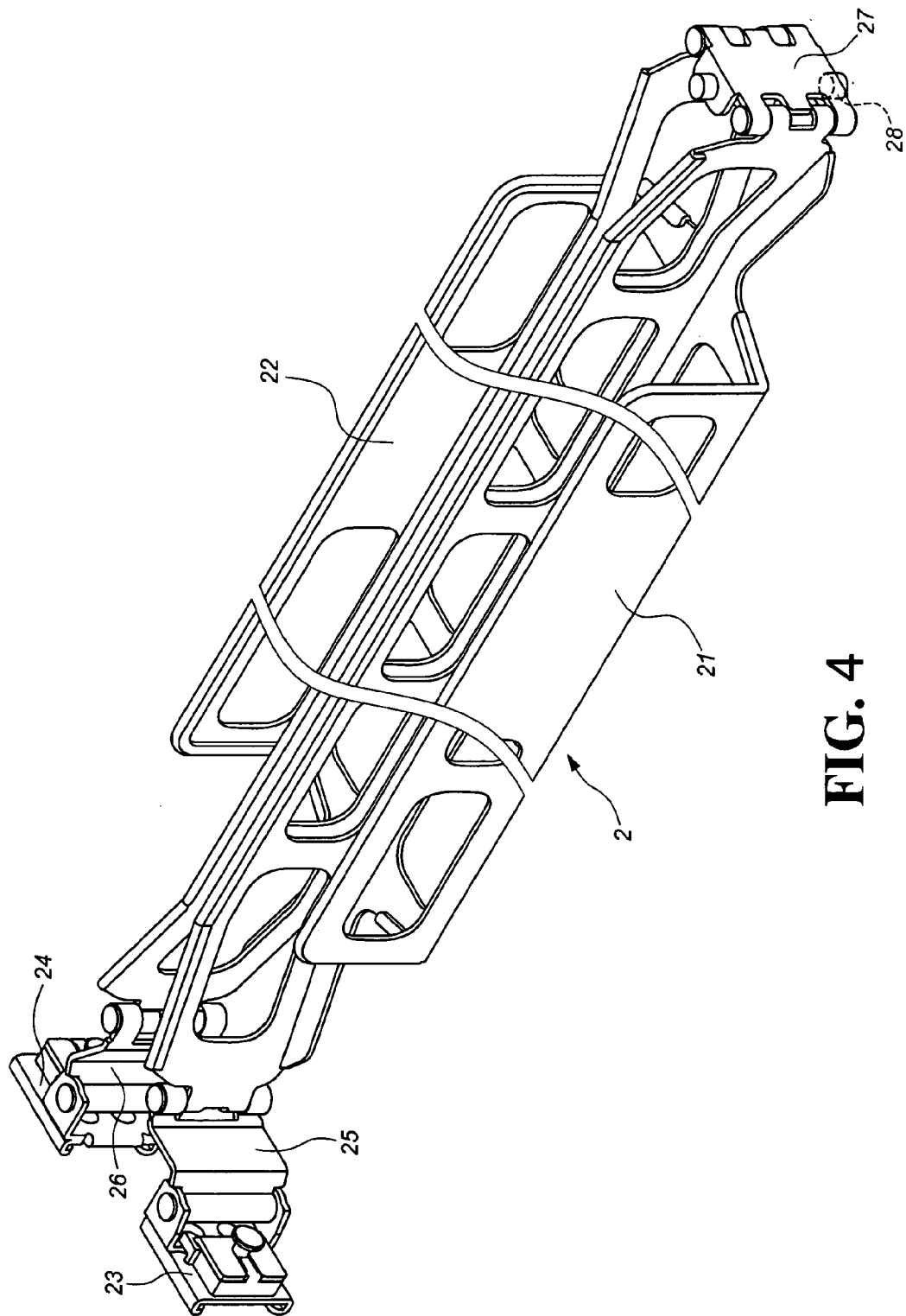
FIG. 4 is a perspective view showing a cable management arm with more joints according to the preferred embodiment of the present invention.

As shown in FIG. 3, a cable management arm 2 with less joints composes a first arm 21, a second arm 22, a movable portion 23, and a fixed portion 24. The first arm 21 has one end connected with one end of the second arm 22. The movable portion 23 is connected with the other end of the first arm 21 while the fixed portion 24 is connected with the other end of the second arm 22. The movable portion 23 and the fixed portion 24 comprise a fastening unit 6. As shown in FIG. 4, another type of cable management arm 2 with more joints further comprises a first shift member 25 between the first arm 21 and the movable portion 23, a second shift member 26 between the second arm 22 and the fixed portion 24, and an intermediate shelf 27 between the first arm 21 and the second arm 22. This design provides a longer length and pivot capability. The cable management arm 2 further comprises a restricting member 28 located between the moveable portion 23 and the fixed portion 24 corresponding to the supporting frame 1. The restricting member 28, as shown in FIG. 4, is located at the bottom of the intermediate shelf 27 so as to hold against the side of the supporting frame 1 to secure the cable management arm 2 in place in a collapsed status, pleas refer to FIG. 13 for a further details.

Figure 5:
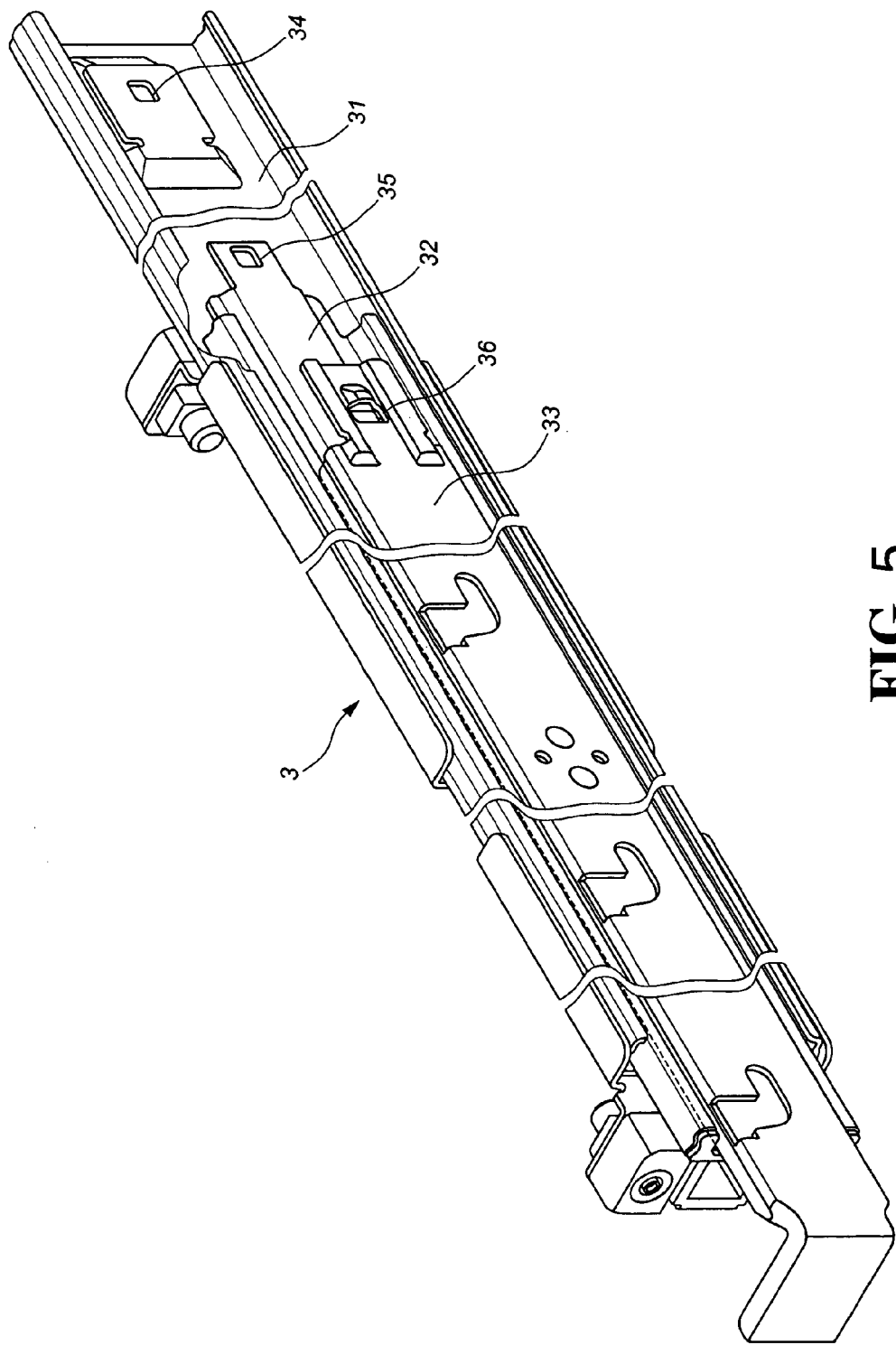
FIG. 5 is a perspective view of a sliding member in the type of three sections according to the preferred embodiment of the present invention.
Figure 6:
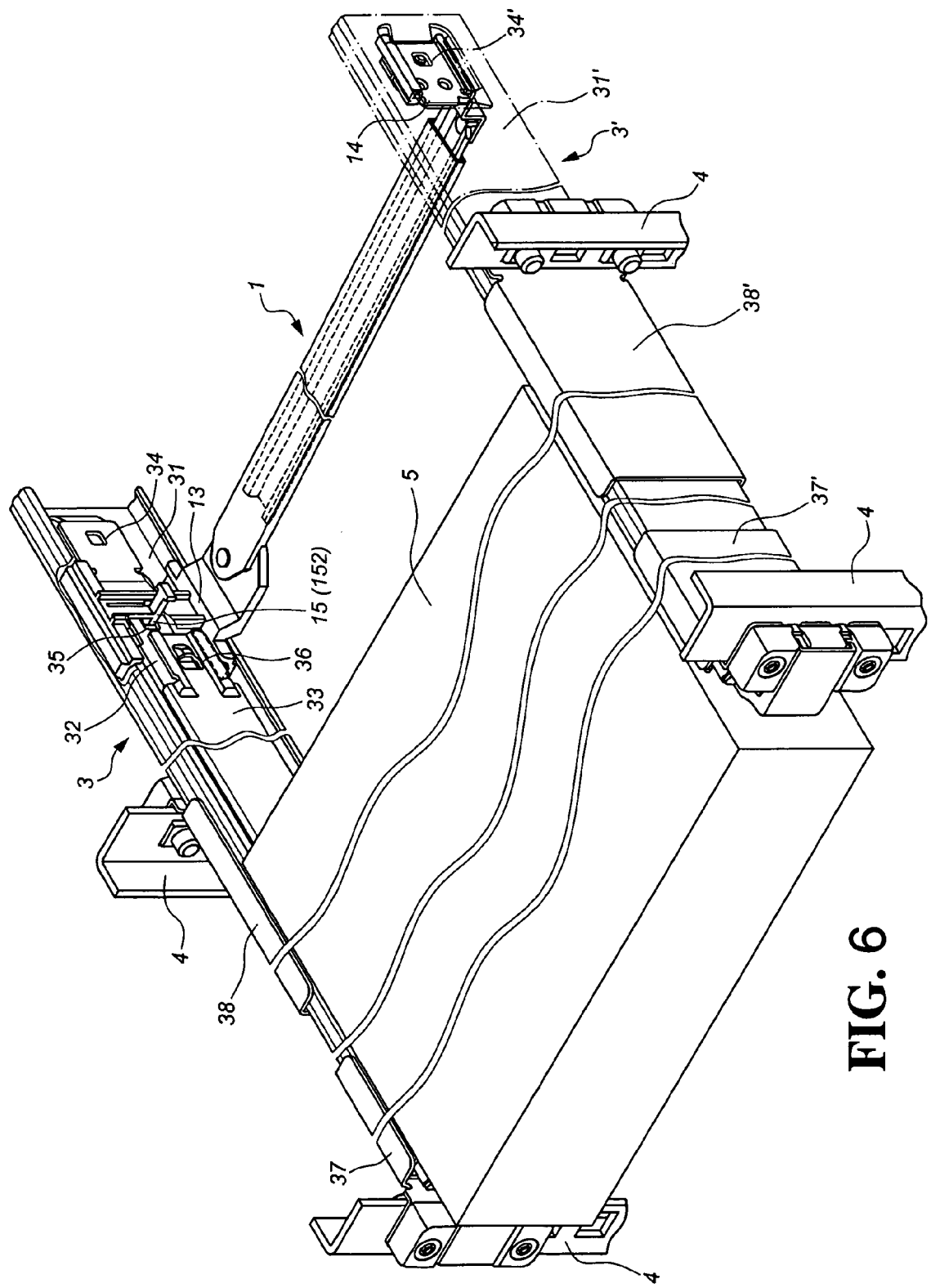
FIG. 6 is a perspective view showing the supporting frame mounted to the sliding member and fixing posts according to the preferred embodiment of the present invention.

As shown in FIG. 5, a sliding member 3 in the form of three sections comprises a fixing rail 31, an extension rail 32, and a traveling rail 33 for installation of the supporting frame 1 and the cable management arm 2. The fixing rail 31 has a connecting portion 34. The extension rail 32 has a second connecting portion 35. The traveling rail 33 has a third connecting portion 36. The coupling member 13 of the supporting frame 1, as shown in FIG. 6, is slidably disposed in the fixing rail 31. The coupling portion 15 (the engaging section 152) of the coupling member 13 corresponds to the second connecting portion 35 of the extension rail 32 to create a relative movement, allowing the coupling member 13 to move along with the extension rail 32. The fixing member 14 at the other end of the supporting frame 1 is connected to another sliding member 3'. As shown in FIG. 6, the fixing member 14 is engaged with a connecting portion 34' of a fixing rail 31' of the sliding member 3'.

Figure 7:
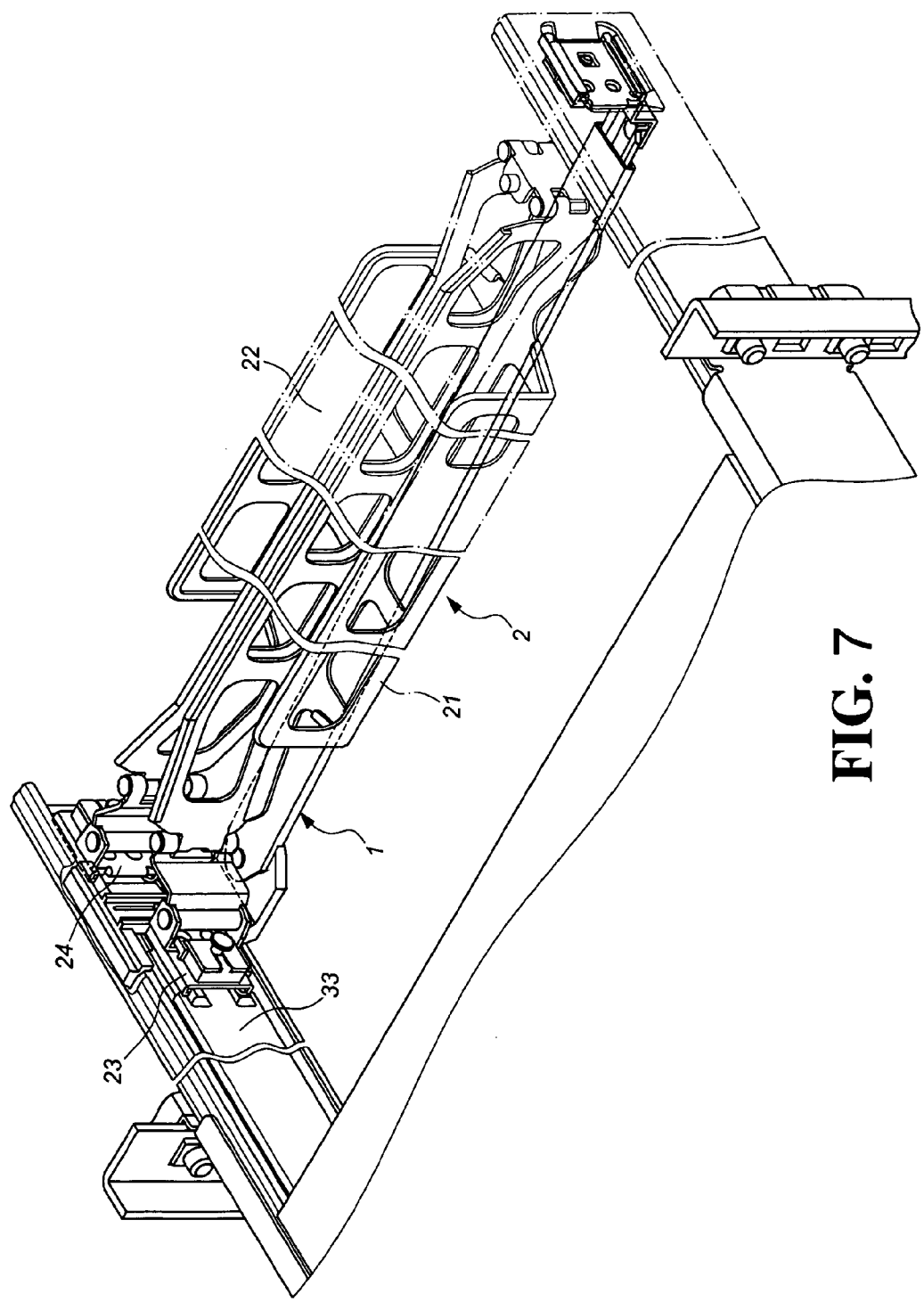
FIG. 7 is a perspective view showing the supporting frame and the cable management arm mounted to the sliding member and the fixing posts according to the preferred embodiment of the present invention.

FIGS. 6 and 7 show the installation of the cable management arm 2 with more joints. The movable portion 23 of the first arm 21 of the cable management arm 2 is connected to the third connecting portion 36 of the traveling rail 33, and the fixed portion 24 of the second arm 22 is connected to the connecting portion 34 of the fixing rail 31. When the cable management arm 2 is collapsed, most of the cable management arm 2 will lean on the supporting frame 1 that provides a supporting to prevent the cable management arm 2 from dropping.

Figure 8:
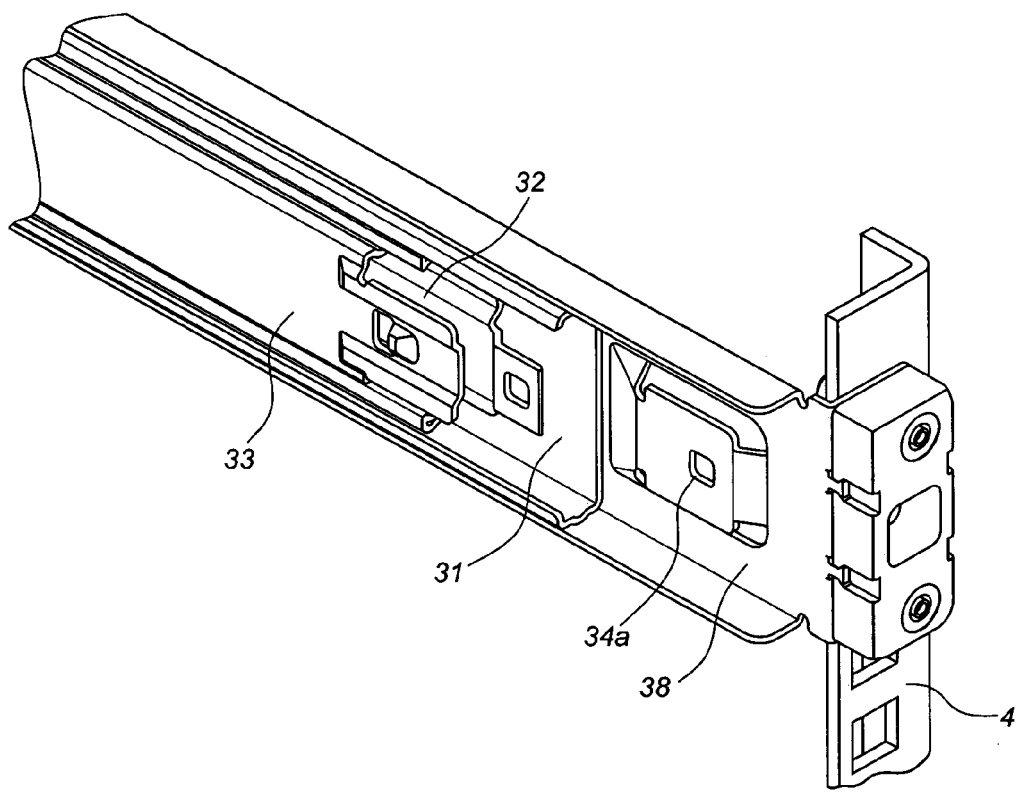
FIG. 8 is a perspective view showing a connecting portion provided on a rear bracket of the sliding member according to the preferred embodiment of the present invention.
Figure 9:
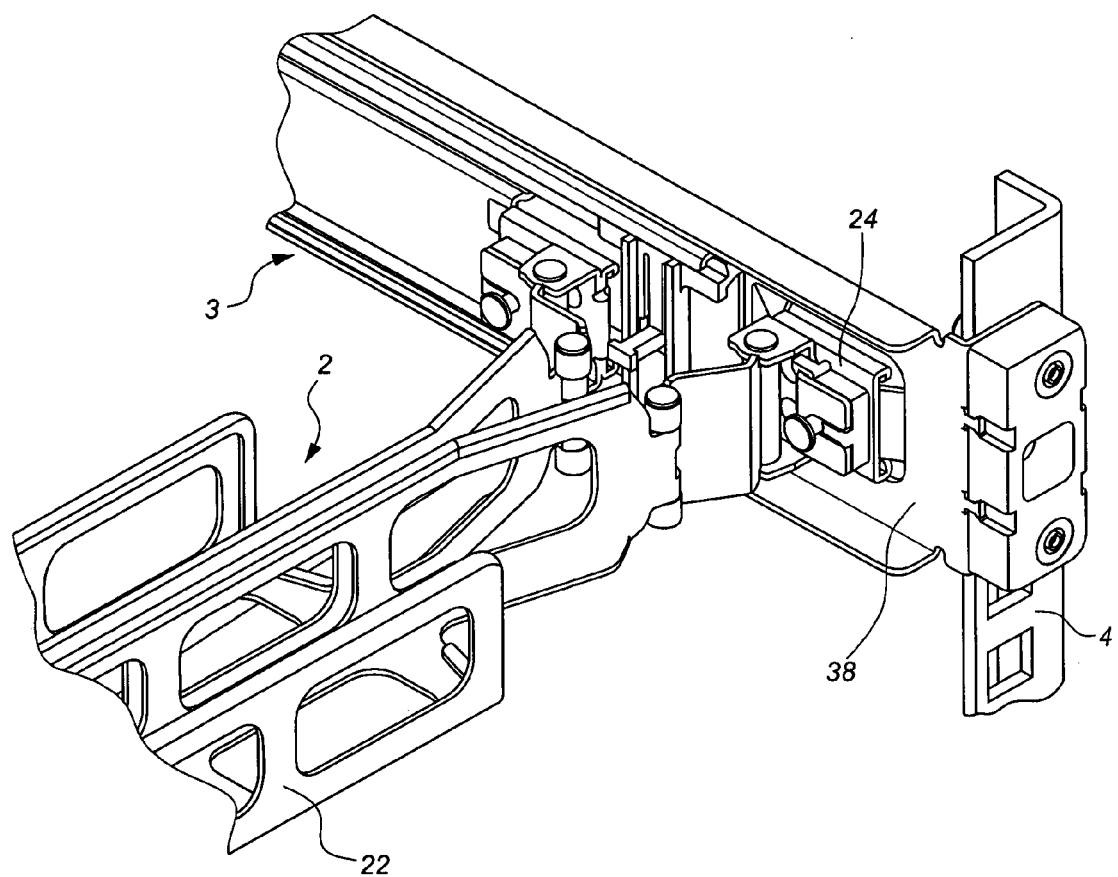
FIG. 9 is a perspective view showing a fixed portion of the cable management arm connected to the connecting portion of the rear bracket according to the preferred embodiment of the present invention.
Figure 10:
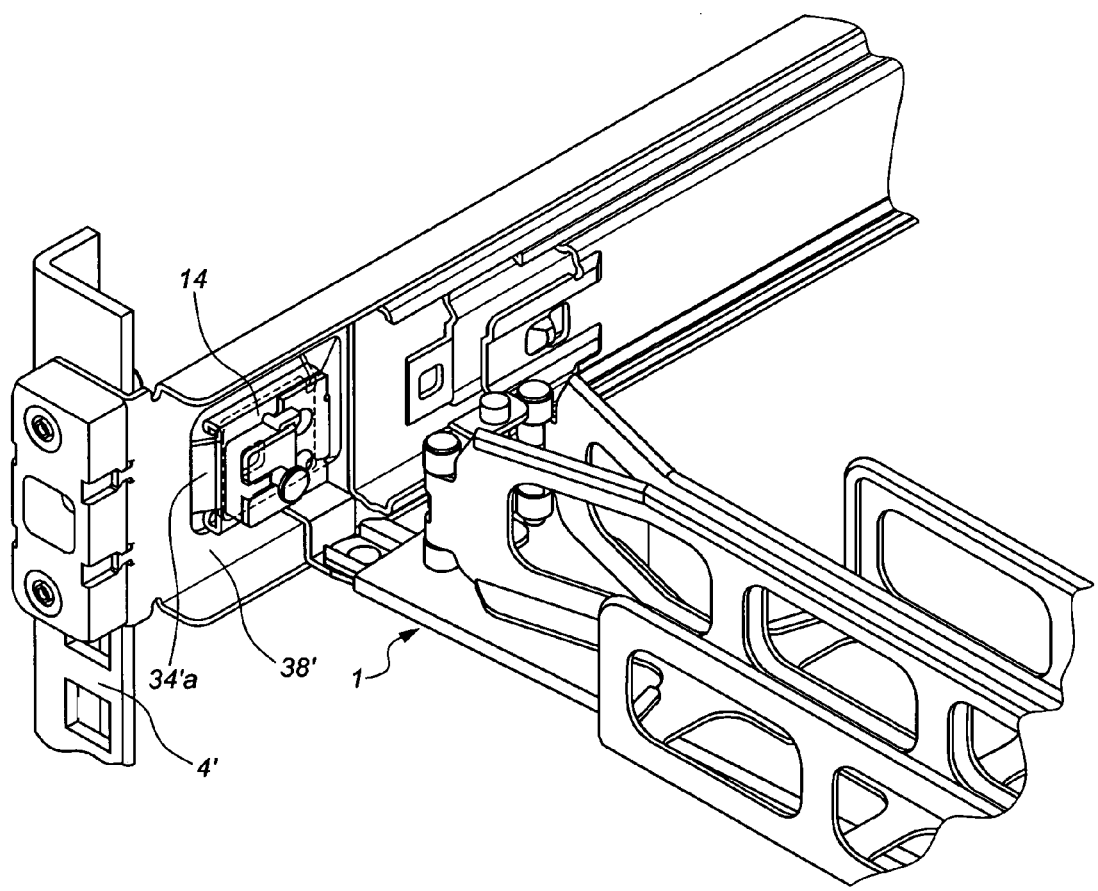
FIG. 10 is a perspective view showing a fixing member of the supporting frame connected to the connecting portion of the rear bracket according to the preferred embodiment of the present invention.

The sliding members 3 and 3' comprise front brackets 37 and 37' and rear brackets 38 and 38' to facilitate installation of fixing posts 4. As shown in FIG. 6, the fixing posts 4 are vertically located at four corners thereof, the sliding members 3 and 3' are mounted at respective sides thereof, and a loading object 5 is carried by the sliding members 3 and 3' to slide along with the sliding members 3 and 3'. The rear bracket 38 of the sliding member 3 may be deemed an extension of the fixing rail 31, therefore, the connecting portion 34a, as shown in FIGS. 8 and 9, is provided on the rear bracket 38 to connect with the fixed portion 24 of the second arm 22 of the cable management arm 2. As shown in FIG. 10, the fixing member 14 of the supporting frame 1 may be connected with the connecting portion 34a' of the rear bracket 38'.

Figure 11:
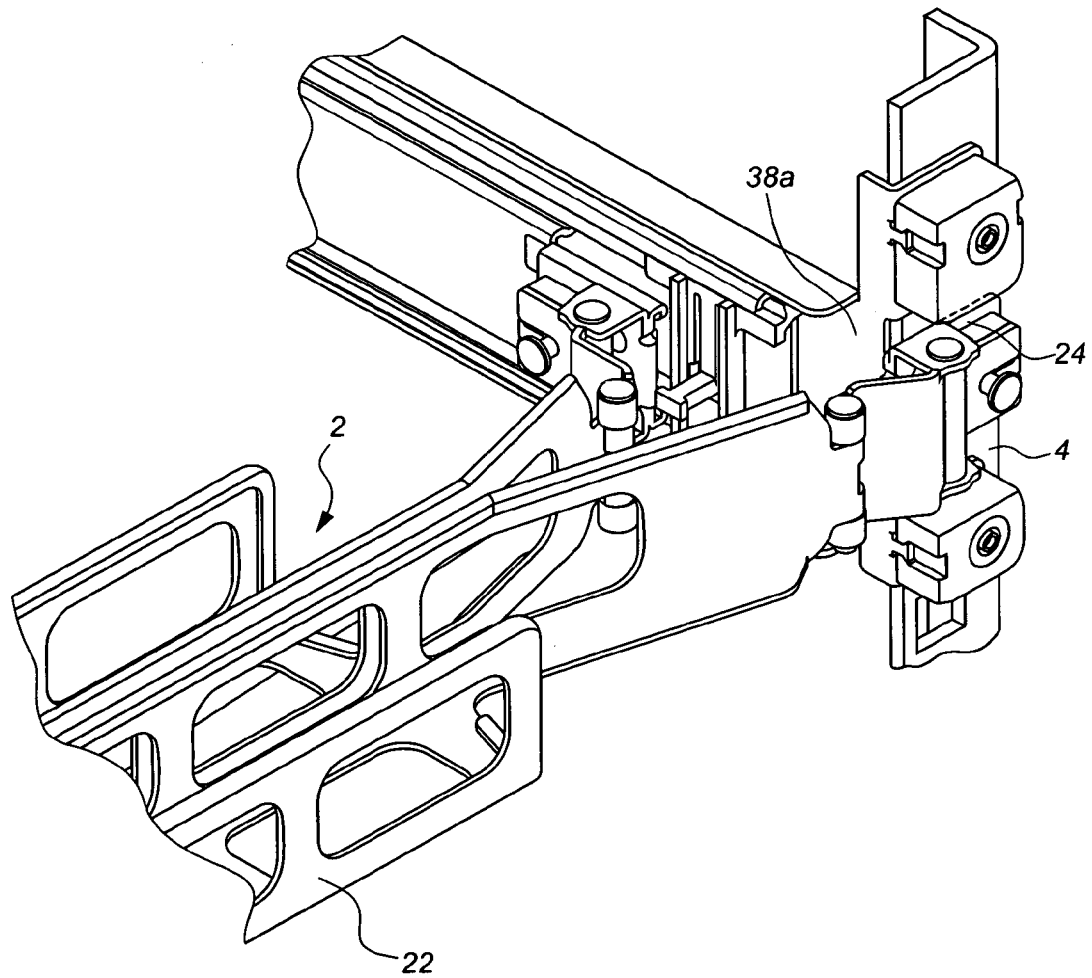
FIG. 11 is a perspective view showing the fixed portion of the cable management arm connected to the fixing post according to the preferred embodiment of the present invention.
Figure 12:
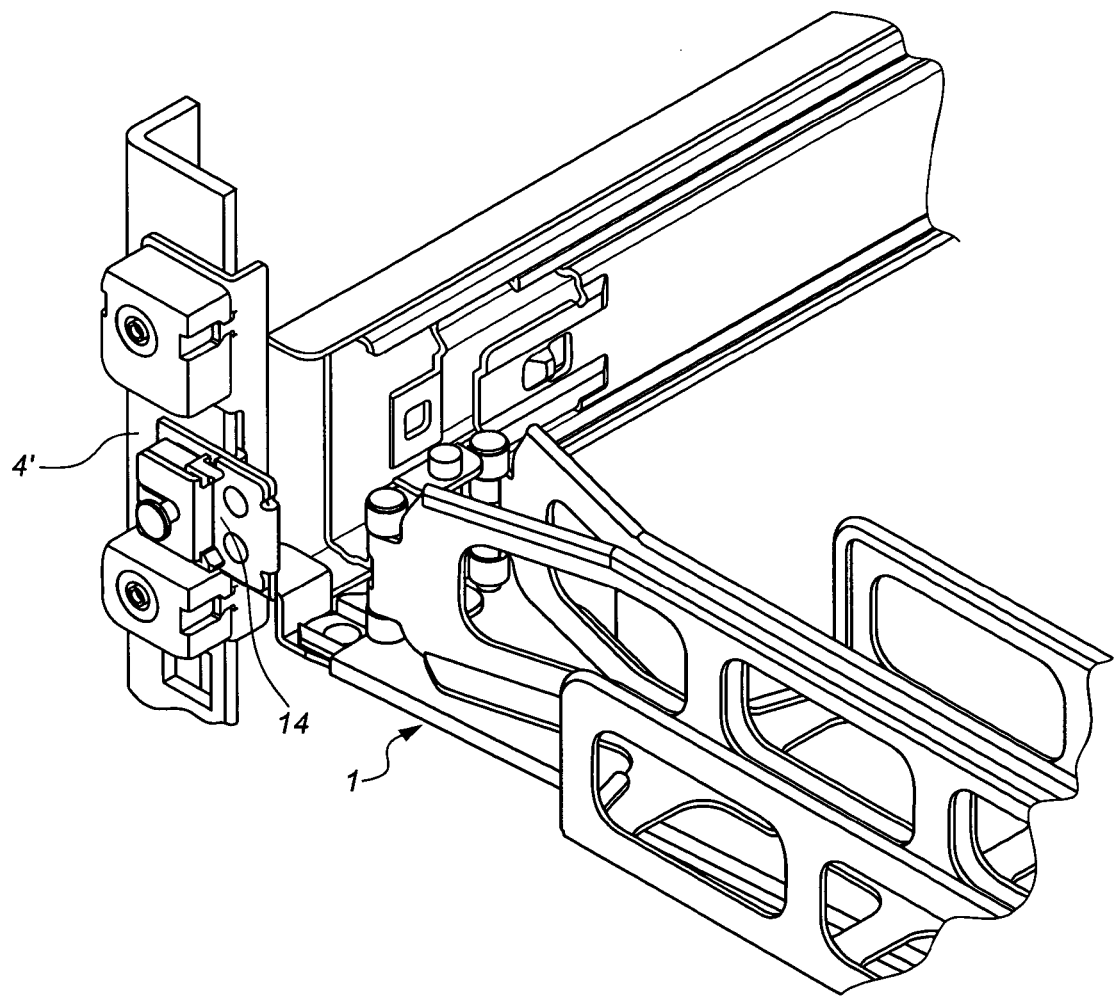
FIG. 12 is a perspective view showing the fixing member of the supporting frame connected to the fixing post according to the preferred embodiment of the present invention.

As shown in FIG. 11, the back racket 38a is coupled to the fixing post 4, and the fixed portion 24 of the second arm 22 of the cable management arm 2 is also connected to the fixing post 4. With such an arrangement, the fixing member 14 at the other end of the supporting frame 1 may be connected to the fixing post 4', as shown in FIG. 12.

Figure 13:
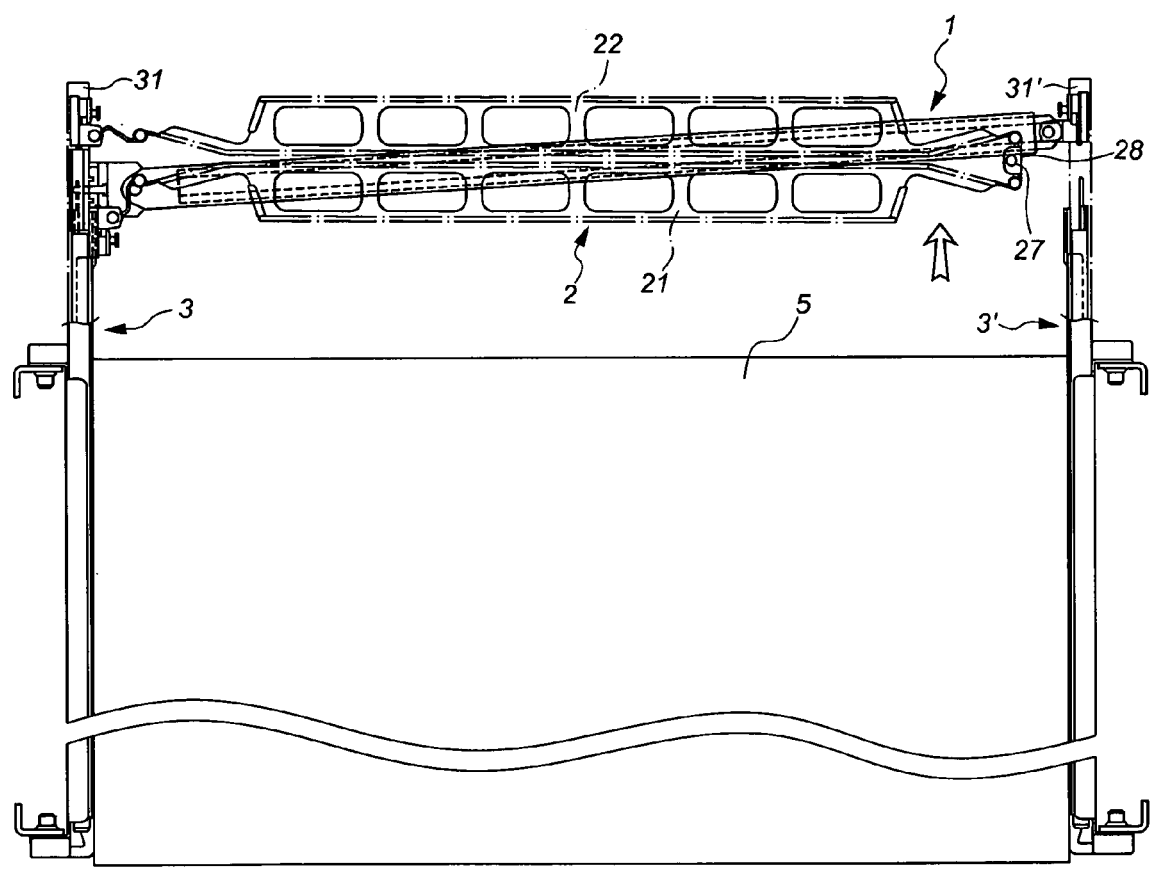
FIG. 13 is a top view showing the cable management arm and the supporting frame at a first position in a collapsed status according to the preferred embodiment of the present invention.

As shown in FIG. 13, the cable management arm 2 is in a collapsed status. When cable is winding in the cable management arm 2, the cable management arm 2 will swing backwards due to the tension from the cable. The backward swing of the cable management arm 2 is confined by the restricting member 28 at the bottom of the intermediate shelf 27, and the restricting member 28 holds against one side of the supporting frame 1.

Figure 14:
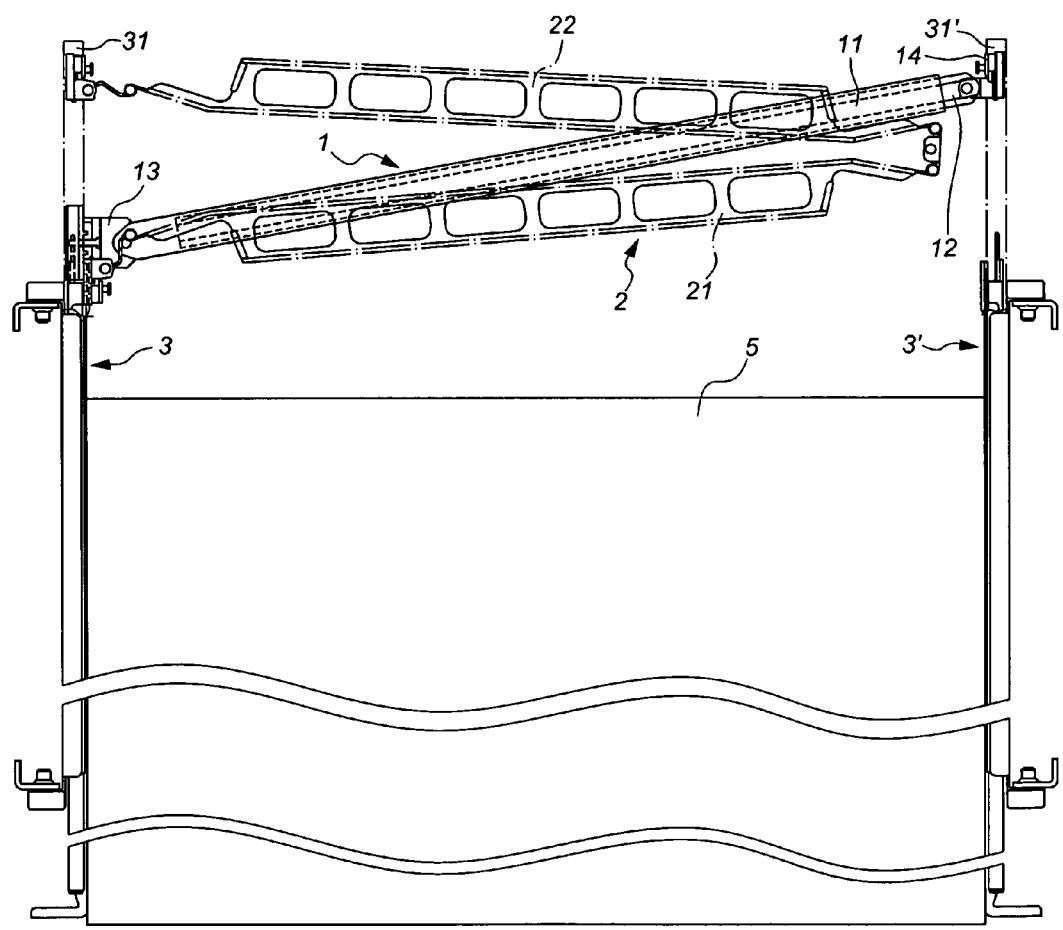
FIG. 14 is a top view showing the cable management arm and the supporting frame being pulled along with the sliding member according to the preferred embodiment of the present invention.
Figure 15:
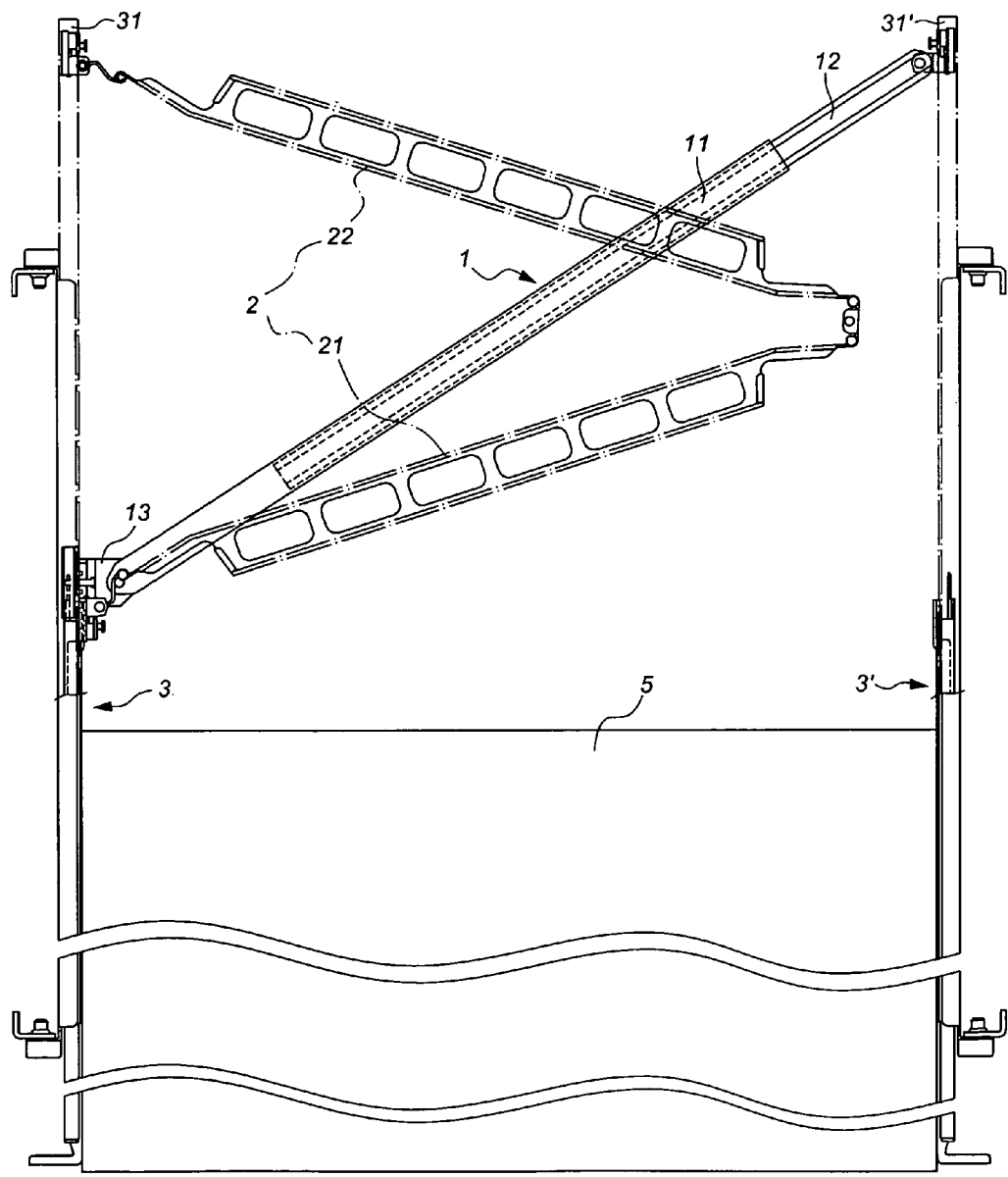
FIG. 15 is a top view showing the cable management arm and the supporting frame being further pulled along with the sliding member according to the preferred embodiment of the present invention.
Figure 16:
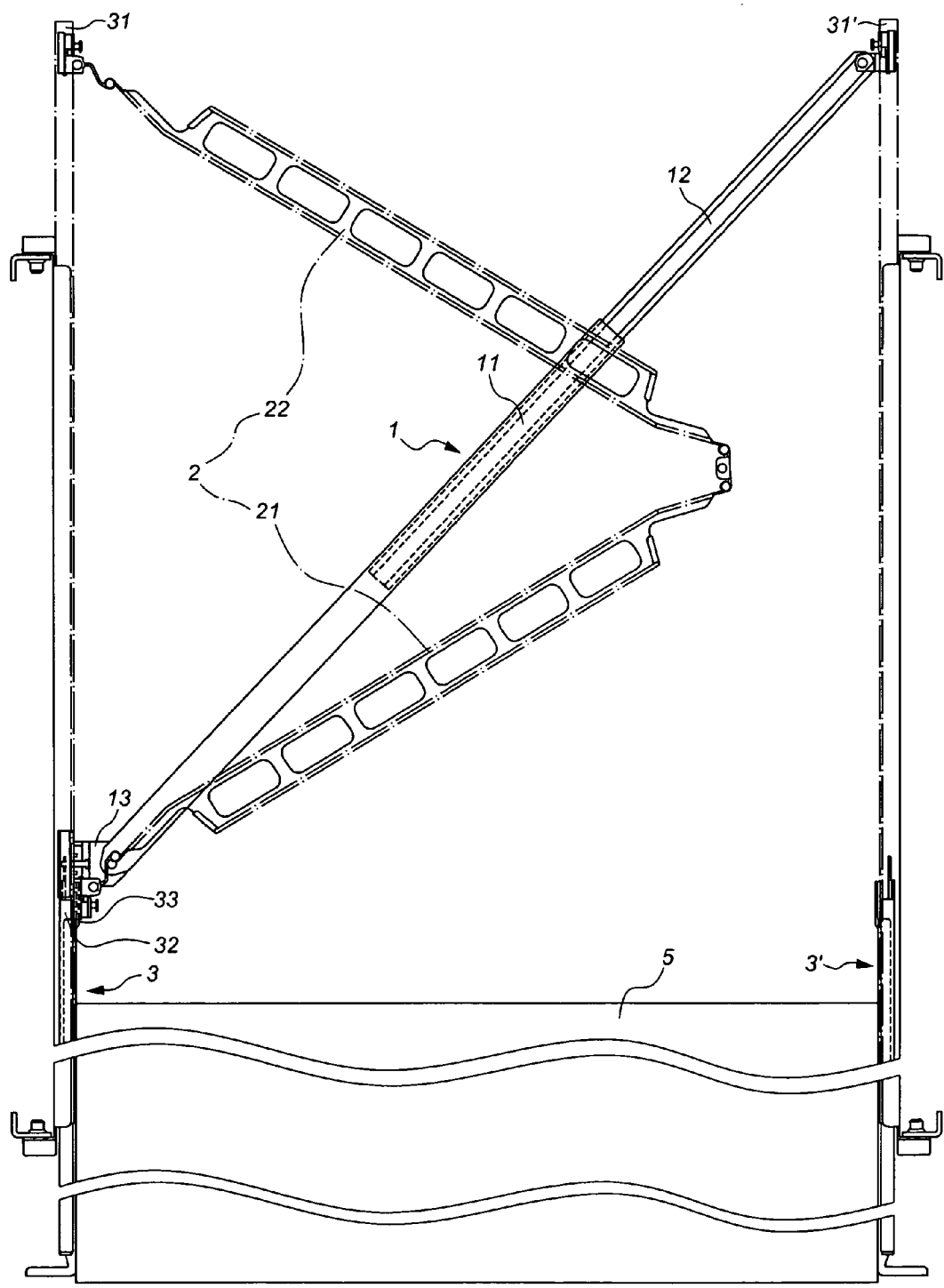
FIG. 16 is a top view showing the cable management arm and the supporting frame being pulled along with the sliding member to a second position according to the preferred embodiment of the present invention.

When the cable management arm 2 is pulled and extended along with the sliding member 3 outwardly, as shown in FIGS. 14 to 16, the first arm 21 of the cable management arm 2 and the coupling member 13 of the supporting frame 1 will move along with the pulling force from the traveling rail 33 and the extension rail 32. The traveling rail 33 and the extension rail 32 slide synchronously with the sliding member 3 to a preset distance. The fixing member 14 of the second frame 12 of the supporting frame 1 is connected to a rear end of the fixing rail 31' of the sliding member 3', so that when the coupling member 13 of the supporting frame 1 departs its original position, the first frame 11 and the second frame 12 of the supporting frame 1 will be extended relatively and slanted forwards. The more of the traveling rail 33 pulling, the wider angle the first arm 21 and the second arm 22 will be, and the longer the first frame 11 and the second frame 12 of the cable management arm 2 will extend. The second arm 22 of the cable management arm 2 leans on the first frame 11 of the supporting frame 1, as shown in FIG. 15.

Figure 17:
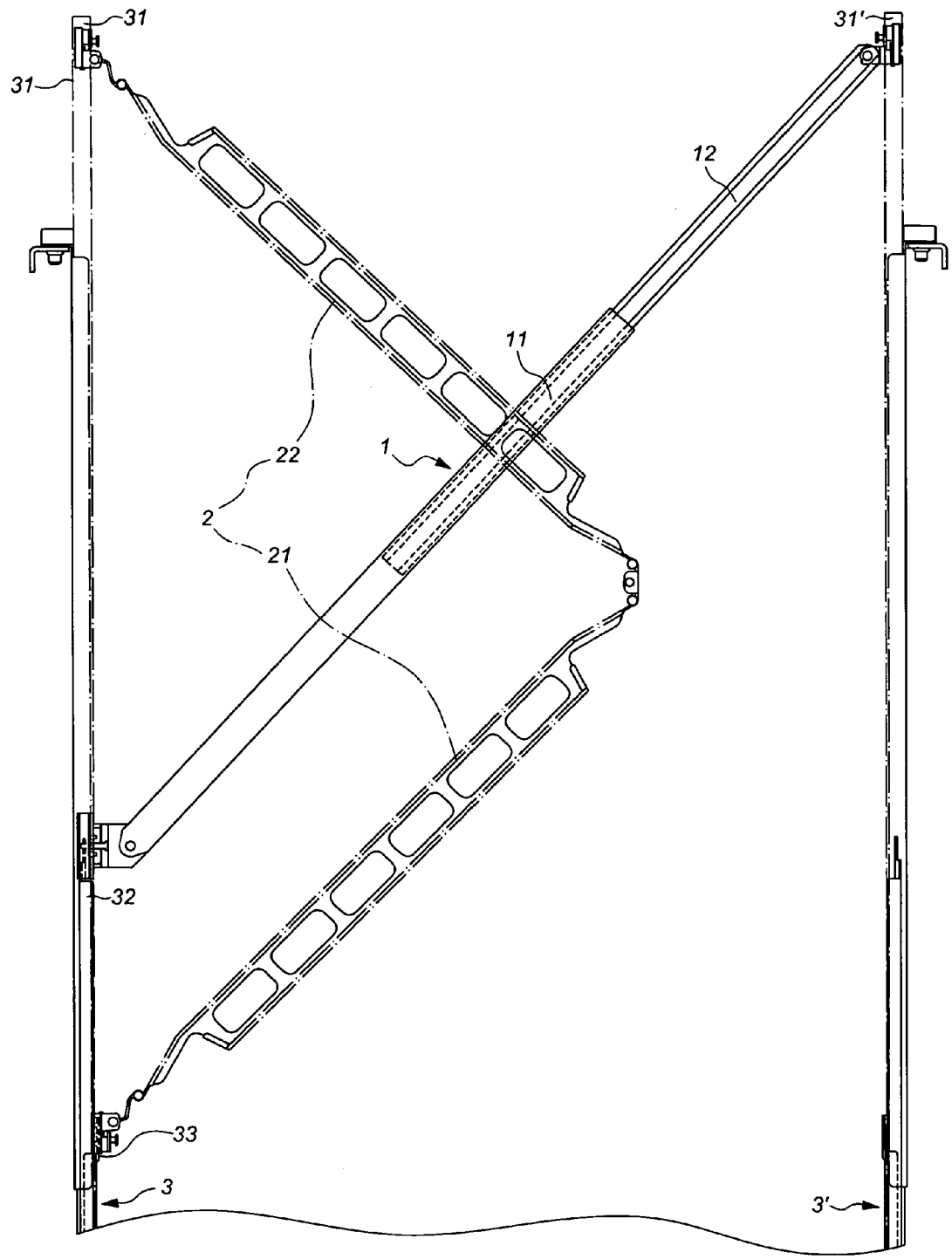
FIG. 17 is a top view showing the supporting frame being pulled along with the sliding member at the second position and the cable management arm being further extended according to the preferred embodiment of the present invention.

When the traveling rail 33 and the extension rail 32 of the sliding member 3 are pulled to a second preset position, as shown in FIG. 16, the pulling force against the extension rail 32 will be stopped. The coupling member 13 of the supporting frame 1 is positioned in place. The traveling rail 33 of the sliding member 3 continues moving. The continuous extension of the traveling rail 33 will bring the first arm 21 and the second arm 22 of the cable management arm 2 to expand to a wider angle, as shown in FIG. 17.

Figure 18:
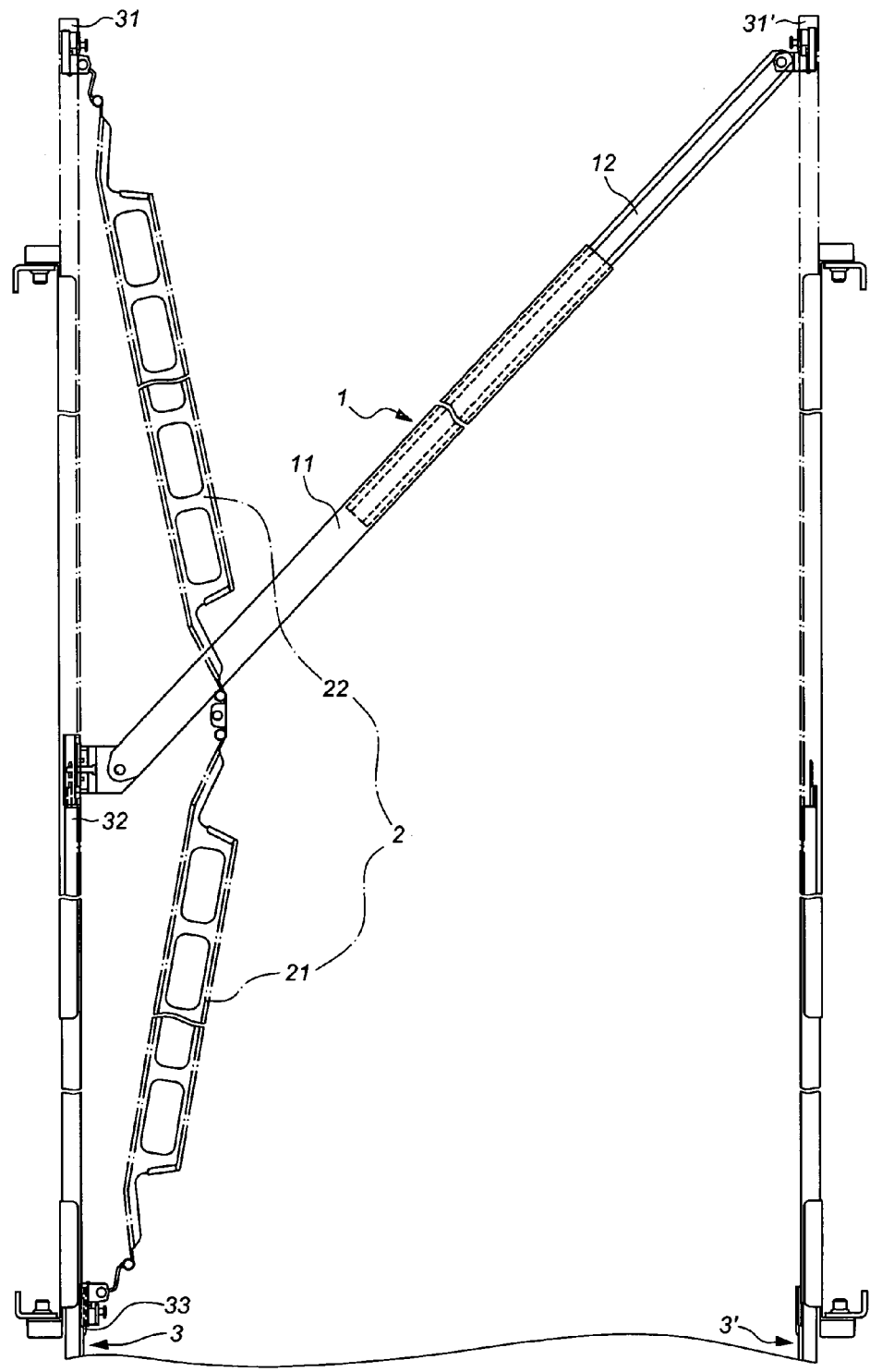
FIG. 18 is a top view showing the supporting frame being pulled to the second position and the cable management arm being extended to the terminal at a third position according to the preferred embodiment of the present invention.

When the traveling rail 33 of the sliding member 3 reaches its final position, as shown in FIG. 18, the first arm 21 and the second arm 22 of the cable management arm 2 will expand to the widest angle. The cable management arm 2 has its center portion leaning on the supporting frame 1 that prevents the cable management arm 2 from dropping.

Figure 19:
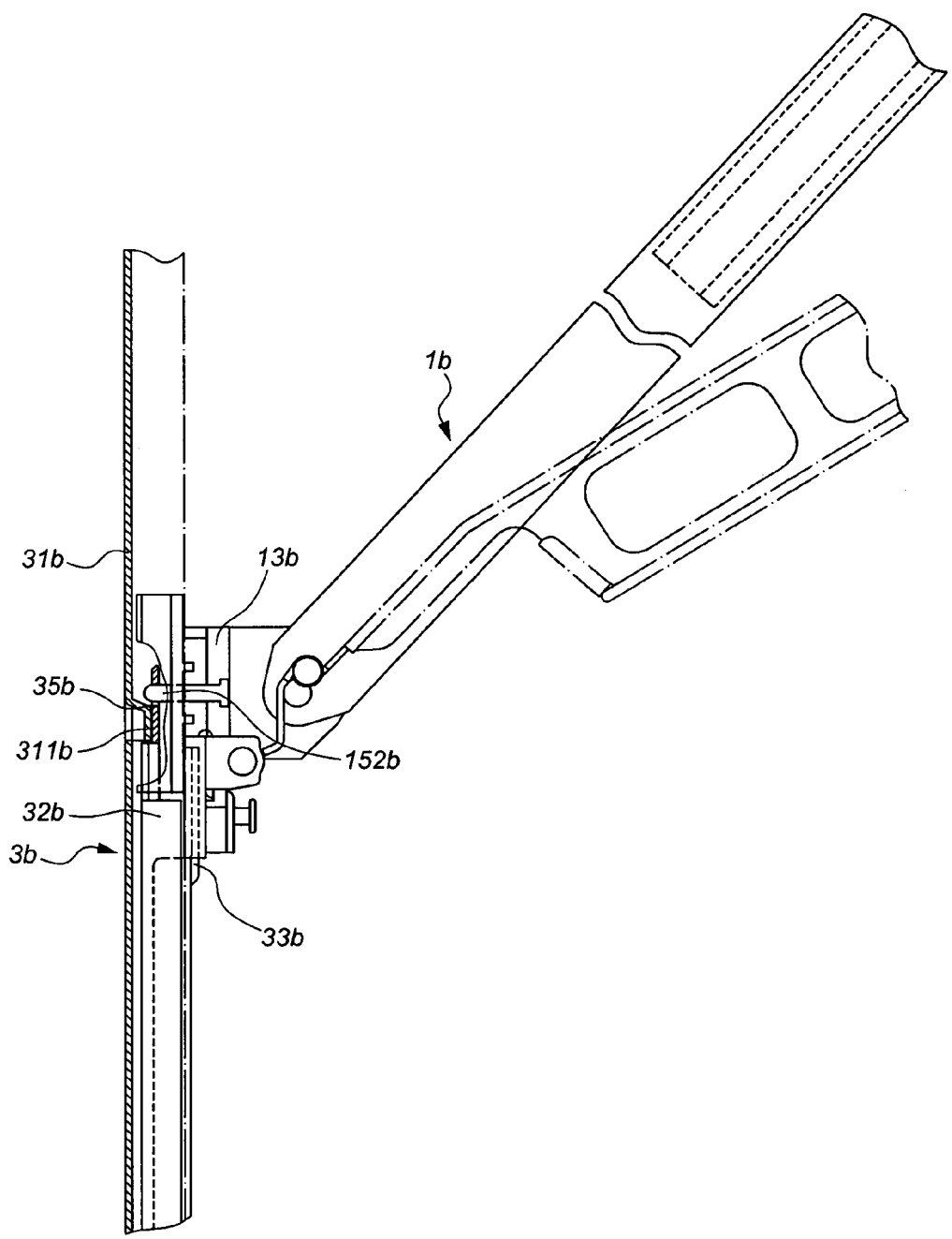
FIG. 19 is a top view showing the coupling member of the supporting frame and an extension rail of the sliding member being provided with a releasing structure according to the preferred embodiment of the present invention.
Figure 20:
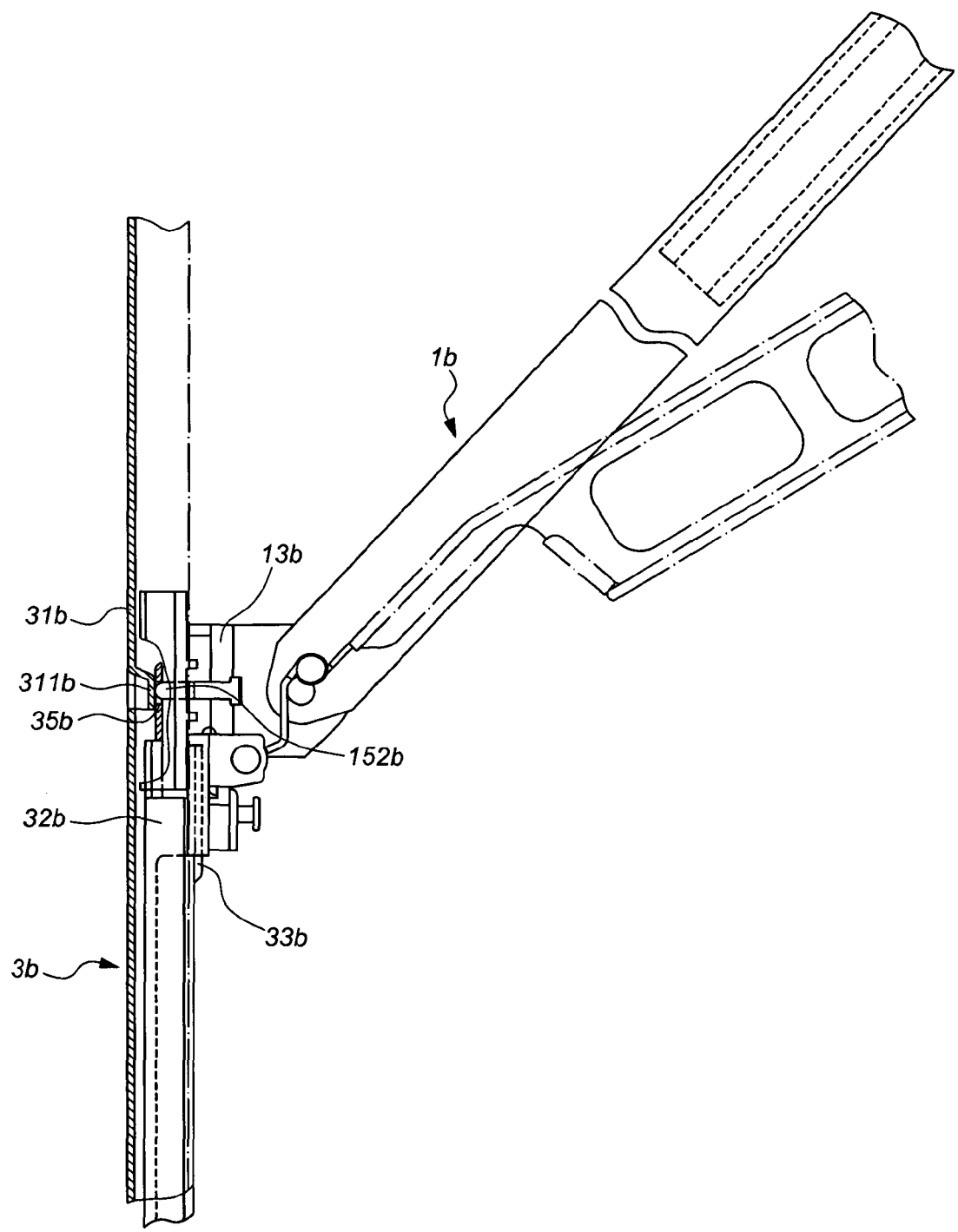
FIG. 20 is a top view showing the releasing structure of the coupling member of the supporting frame and the extension rail of the sliding member being in a first operating status according to the preferred embodiment of the present invention.
Figure 21:
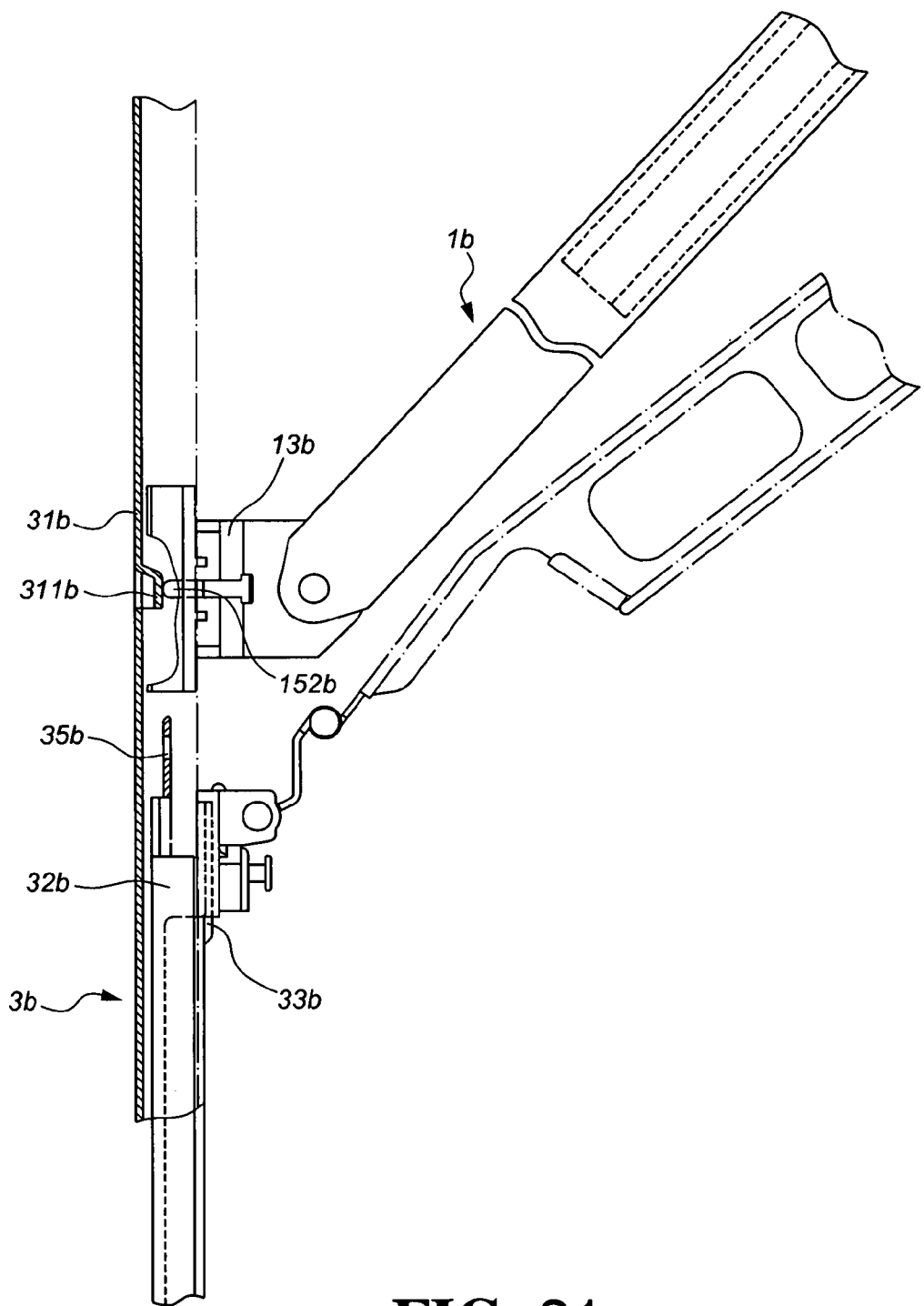
FIG. 21 is a top view showing the releasing structure of the coupling member of the supporting frame and the extension rail of the sliding member being in a second operating status according to the preferred embodiment of the present invention.

Another situation of the above-mentioned embodiment is that the coupling member 13b of the supporting frame 1b is pulled along with the extension rail 32b to the second preset position, and the extension rail 32b requires passing over the second preset position or the supporting frame 1b is confined with its length. In a preferred embodiment, this may be done by releasing the connection of the coupling member 13b and the extension rail 32b. As shown in FIGS. 19 and 20, the fixing rail 31b of the sliding member 3b is provided with an actuating portion 311b. When the second connecting portion 35b at the rear end of the extension rail 32b moves towards the actuating portion 311b and the engaging section 152b of the coupling member 13b touches the actuating portion 311b, the engaging section 152b will be pushed away by the actuating portion 311b, the supporting frame 1b will extend to the terminal, and the extension rail 32b will be further pulled. The second connecting portion 35b is forced to disengage from the engaging section 152b, as shown in FIG. 21. The extension rail 32b disengages from the coupling member 13b of the supporting frame 1b, and is free to move independently.

Figure 22:
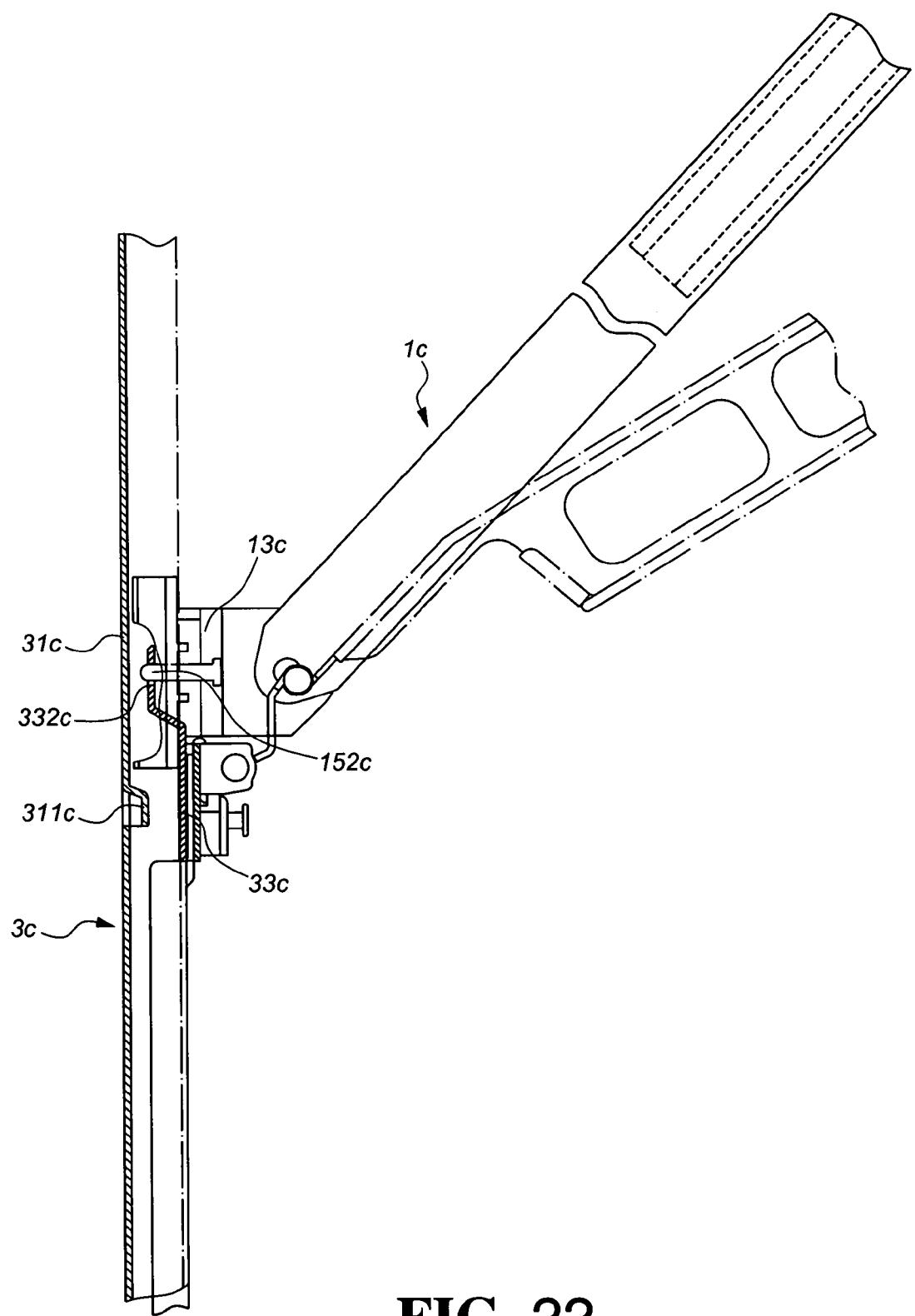
FIG. 22 is a top view showing the sliding member in the type of two sections and a releasing structure to disengage from the coupling member according to the preferred embodiment of the present invention.
Figure 23:
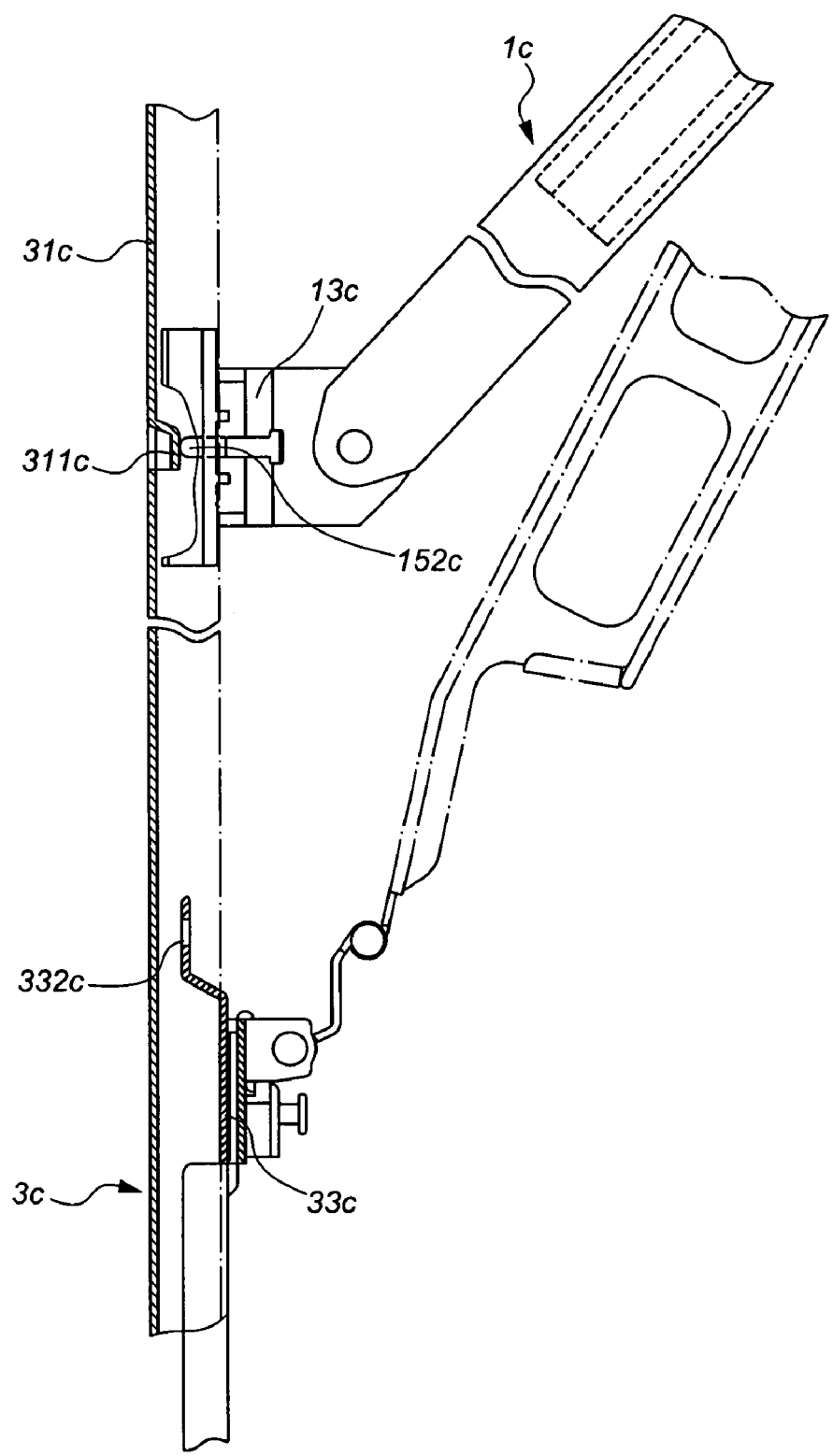
FIG. 23 is a top view similar to FIG. 22 showing the coupling member being released.

As shown in FIG. 22, the above-mentioned embodiment is applied to the sliding member 3C in the type of two sections, the fixing rail 31C and the traveling rail 33C. The traveling rail 33C of the sliding member 3C is provided with a fourth connecting portion 332C at a rear end thereof to facilitate the coupling member 13c of the supporting frame 1c to be secured in the fixing rail 31c of the sliding member 3c. This arrangement provides a linking relation between the coupling member 3c and the fourth connecting portion 332c. The linking relation may be released, as shown in FIGS. 22 and 23. The actuating portion 311c is provided on the fixing rail 31c. When the supporting frame 1c extends to its terminal and the fourth connecting portion 332c at the rear end of the traveling rail 33c passes over the actuating portion 311c, the fourth connecting portion 332c will be forced to disengage from the engaging section 152c of the coupling member 13c. The traveling rail 33c may be further pulled independently.

Figure 24:
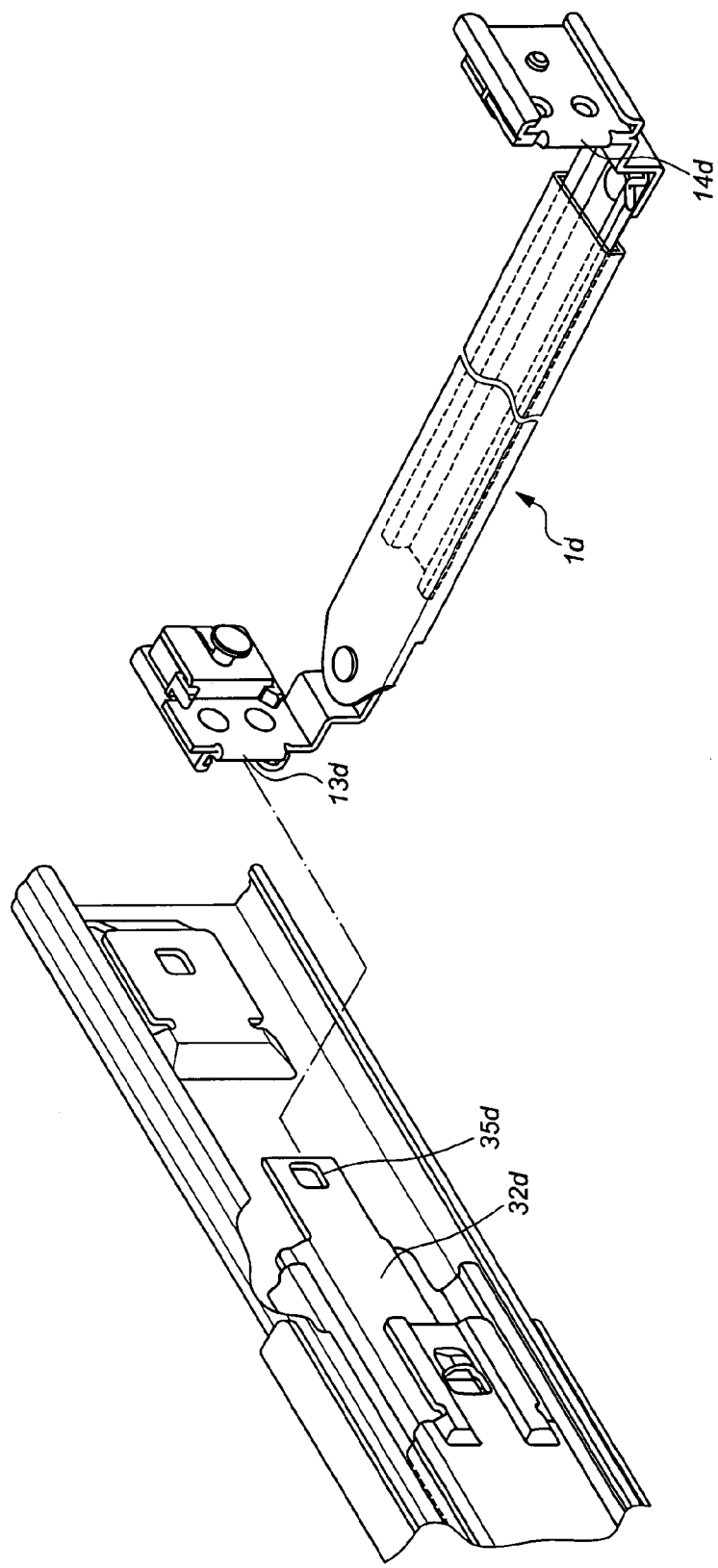
FIG. 24 is a perspective view showing an equivalent coupling member corresponding to a second connecting portion of the extension rail according to the preferred embodiment of the present invention.

As shown in FIG. 24, the coupling member 13d of the supporting frame 1d may be designed like the fixing member 14d. The coupling member 13d is coupled to the second connecting portion 35d of the extension rail 32d.

Figure 25:
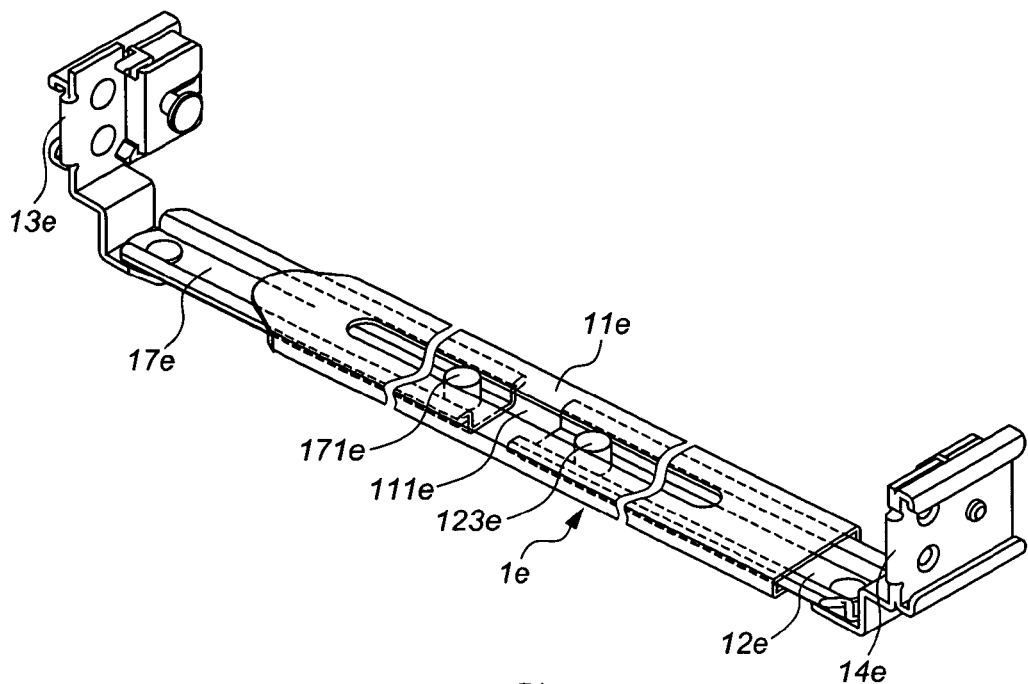
FIG. 25 is a perspective view showing the supporting frame in the type of three sections with a configuration to restrict the extension thereof according to the preferred embodiment of the present invention.

As shown in FIG. 25, the supporting frame 1e may be in the type of three sections, a first frame 11e, a second frame 12e, and a third frame 17e. The supporting frame 1e comprises a coupling member 13e and a fixing member 14e. The second frame 12e and the third frame 17e are inserted into two ends of the first frame 11e. The outer end of the second frame 12e is connected to the fixing member 14e. The outer end of third frame 17e is connected to the coupling member 13e. A further design is to confine the extension of both the second frame 12e and the third frame 17e with respect to the first frame 11e. The first frame 11e has a restricting groove 11e. The second frame 12e and the third frame 17e are provided with protuberances 123e and 171e, respectively. By the protuberances 123e and 171e sliding within the restricting groove 111e, the extension of the supporting frame 1e is restricted.

Figure 26:
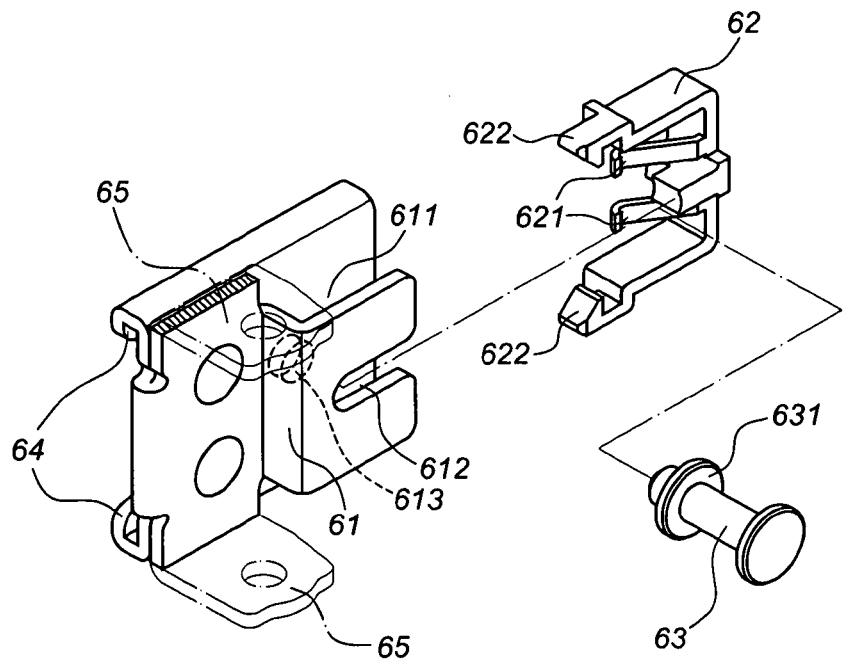
FIG. 26 is an exploded view of a fastening unit according to the preferred embodiment of the present invention.
Figure 27:
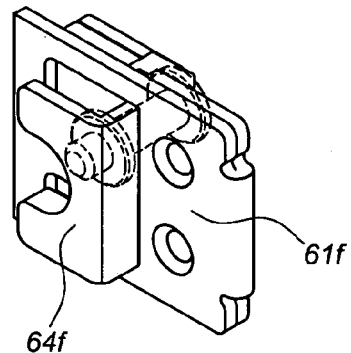
FIG. 27 is a perspective view showing the fastening unit in another form of equivalent configuration according to the preferred embodiment of the present invention.
Figure 28:
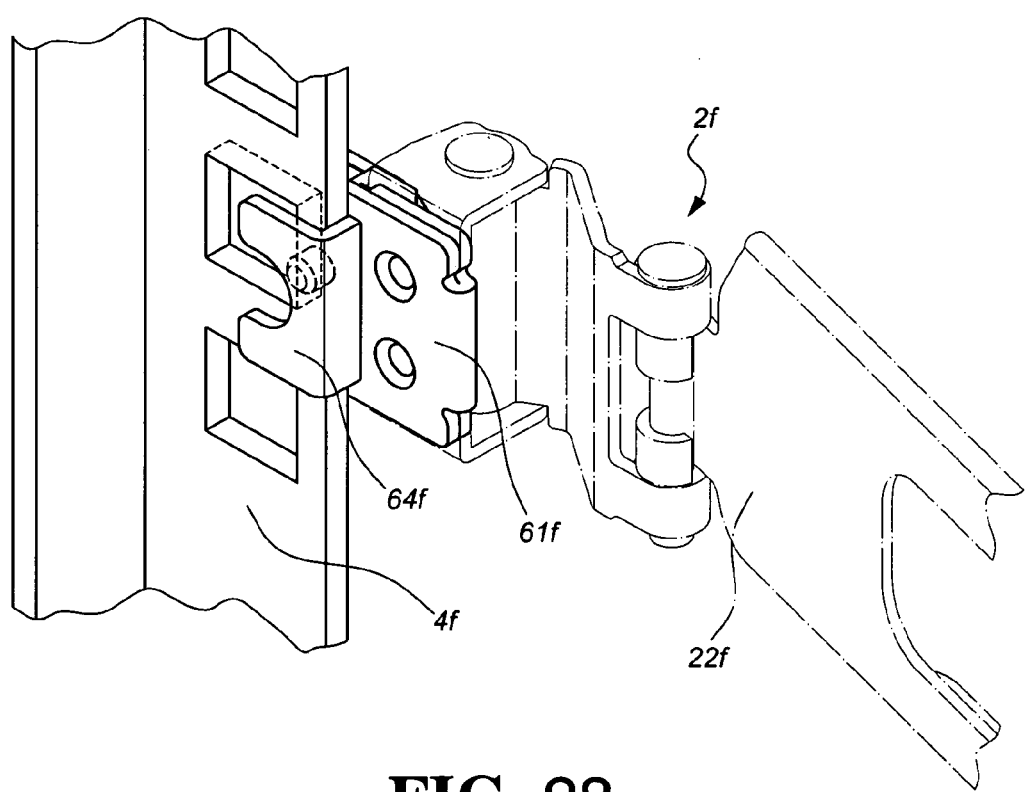
FIG. 28 is a perspective view showing the fastening unit coupled to the fixing post (applied to the cable management arm) according to the preferred embodiment of the present invention.
Figure 29:
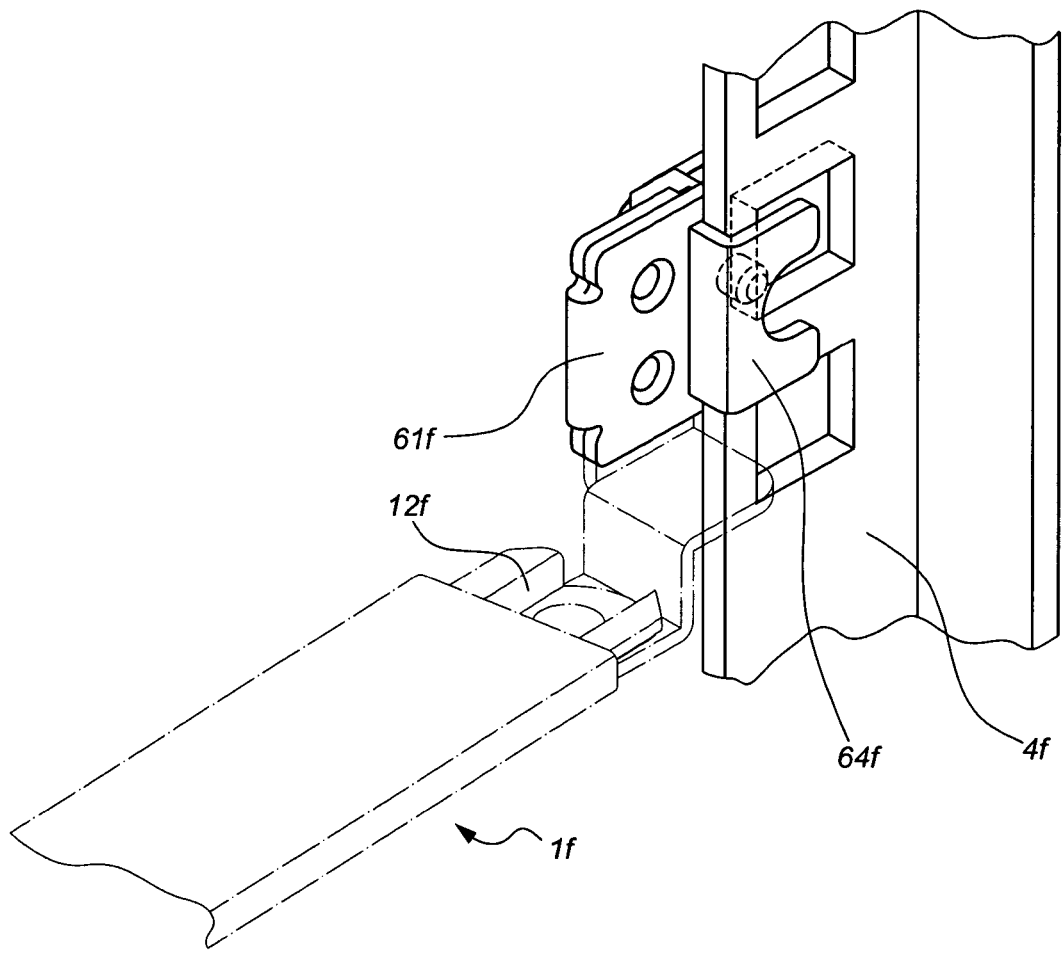
FIG. 29 is a perspective view showing the fastening unit coupled to the fixing post (applied to the supporting frame) according to the preferred embodiment of the present invention.

Furthermore, the above-mentioned fastening unit 6 is the same configuration but installed in different directions, and is applied to the fixing member 14 of the supporting frame 1, the movable portion 23 and the fixed portion 24 of the cable management arm 2. The fastening unit 6 comprises a base 61, a resilient seat 62, and a latch 63, as shown in FIG. 26. The base 61 has an accommodating room 611, an open groove 612, and a through hole 613. The accommodating room 611 is adapted for the resilient seat 62 to seat therein. The latch 63 has a front section inserting through the open groove 612, a middle section passing the resilient seat 62, and a rear section inserting into the through hole 613. The resilient seat 62 has a resilient leg 621 and an engaging projection 622. The latch 63 has a stress portion 631 to hold against the resilient leg 621. The engaging projection 622 is engaged with the base 61 and secured thereat. The base 61 further has a holding portion 64 to secure a loading object which can be locked by the latch 63. Furthermore, the base 61 further comprises a single or a pairs of pivot ears 65 in order to connect the supporting frame 1 and the cable management arm 2. The holding portion 64f of the base 61f, as shown in FIG. 27, can be formed in different directions or in different shapes. The base 61f may work with the second arm 22f of the cable management 2f, as shown in FIG. 28, for connecting to the fixing post 4f. As shown in FIG. 29, the base 61f is coupled to the second frame 12f of the supporting frame If for connecting to the fixing post 4f.

What is claimed is:

1. A cable management arm supporting device, comprising:
    a pair of sliding members each including at least a fixing rail coupled to a corresponding portion of a supporting structure, a traveling rail displaceable relative to the fixing rail, and a connecting portion formed on the fixing rail;
    a cable management arm including a first arm and a second arm, one end of the first arm being pivotally connected to one end of the second arm, another end of the first arm being coupled to the traveling rail of a first of the pair of sliding members for displacement therewith from a first position to a second position, another end of the second arm being coupled to the connecting portion of the fixing rail of the first of the pair of sliding members;
    a first frame having a pivotal portion and a casing portion at respective ends thereof;
    a second frame having an inserting portion and a fixing portion at respective ends thereof, the inserting portion of the second frame being inserted into the casing portion of the first frame to be telescopically extendable therefrom;
    a coupling member pivotally connected to the pivotal portion of the first frame, the coupling member being slidingly coupled to the first of the pair of sliding members and having a coupling portion for engagement with the first of the pair of sliding members to be displaceable therewith independently of the cable management arm coupled to the first of the pair of sliding members; and a fixing member connected to the fixing portion of the second frame and affixed to the connecting portion of the fixing rail of a second of the pair of sliding members to secure the fixing portion of the second frame in a fixed location therewith.

2. The cable management arm supporting device, as claimed in claim 1, wherein the fixing member further comprises a fastening unit secured to the second of the pair of sliding members.

3. The cable management arm supporting device, as claimed in claim 2, wherein the fastening unit comprises a base, a resilient seat, and a latch, the base having an accommodating room, an open groove, and a through hole, the resilient seat being inserted into the accommodating room, the latch having a front section inserting through the open groove, a middle section passing the resilient seat and a rear section inserting into the through hole, the resilient seat having a resilient leg and an engaging projection, the latch having a stress portion to hold against the resilient leg: the engaging projection engaging with the base, the base further having a holding portion.

4. The cable management arm supporting device, as claimed in claim 1, wherein the connecting portion of each sliding member being provided adjacent one end of the fixing rail thereof.

5. The cable management arm supporting device, as claimed in claim 1, wherein the fixing rail of each sliding member is connected with a bracket, the connecting portion being provided adjacent one end of the bracket and the bracket being connected to the supporting structure.

6. A cable management arm supporting device, comprising:

two pairs of fixing posts;

a pair of sliding members each including at least a fixing rail extending between and coupled to a respective one of the pairs of fixing posts and a traveling rail displaceable relative to the fixing rail;

a cable management arm including a first arm and a second arm, one end of the first arm being pivotally connected to one end of the second arm, another end of the first arm being coupled to the traveling rail of a first of the pair of sliding members for displacement therewith from a first position to a second position, another end of the second arm being coupled to one fixing post of the respective pair of fixing posts coupled to the fixing rail of the first of the pair of sliding members;

a first frame having a pivotal portion and a casing portion at opposing ends thereof; a second frame having an inserting portion and a fixing portion at opposing ends thereof, the inserting portion of the second frame being inserted into the casing portion of the first frame to be telescopically extendable therefrom;

a coupling member pivotally connected to the pivotal portion of the first frame, the coupling member being slidingly coupled to the first of the pair of sliding members and having a coupling portion for engagement with the first of the pair of sliding members to be displaceable therewith independently of the cable management arm coupled to the first of the pair of sliding members; and a fixing member connected to the fixing portion of the second frame, the fixing member including a fastening unit affixing the fixing member to a fixing post of the pair of fixing posts corresponding to a second of the pair of sliding members for securing the fixing portion of the second frame in a fixed location with respect thereto.

7. The cable management arm supporting device, as claimed in claim 1, wherein the coupling portion is engaged with the traveling rail of the first of the pair of sliding members for displacement of the pivotal portion of the first frame therewith.

8. The cable management arm supporting device, as claimed in claim 1, wherein each sliding member further includes an extension rail, the extension rail being displaceable relative to the fixing rail and the traveling rail being displaceable relative to both the fixing rail and the extension rail: the coupling portion being engaged with the extension rail of the first of the pair of sliding members for displacement of the pivotal portion of the first frame therewith.

9. The cable management arm supporting device, as claimed in claim 1, wherein the first frame and the second frame have a restricting groove and a protuberance corresponding to each other, the protuberance being confined to slide within the restricting groove.

10. The cable management arm supporting device, as claimed in claim 7, wherein the coupling portion has an engaging section releasably engaged with the traveling rail, the first of the pair of sliding members having an actuating portion disposed on the fixing rail and positioned to contact the engaging section as the traveling rail is displaced a certain distance, the actuating portion displacing the engaging section from engagement with the traveling rail to release the coupling member therefrom and thereby limit displacement of the pivotal portion of the first frame relative to the displacement of the traveling rail.

11. The cable management arm supporting device, as claimed in claim 1, wherein the coupling member is slidingly coupled to the fixing rail of the first of the pair of sliding members.

12. The cable management arm supporting device, as claimed in claim 1, wherein each of the sliding members includes the fixing rail, an extension rail, and the traveling rail, the coupling member being connected to the extension rail of the first of the pair of sliding members to be slidable therewith.

13. A cable management arm supporting device comprising two pairs of fixing posts and at least a pair of sliding members secured to a corresponding pair of fixing posts, each of the sliding members including at least a fixing rail and a traveling rail, the traveling rail carrying a loading object, the device further comprising:

a cable management arm including a first arm and a second arm, one end of the first arm being pivotally connected to one end of the second arm, another end of the first arm being coupled to the traveling rail of a first of the pair of sliding members for displacement therewith from a first position to a second position, another end of the second arm being coupled to one fixing post of the corresponding pair of fixing posts coupled to the fixing rail of the first of the pair of sliding members;

a supporting frame comprising a first frame, a second frame, a coupling member, and a fixing member, the first frame having a pivotal portion and a casing portion at respective ends thereof, the second frame having an inserting portion and a fixing portion at respective ends thereof, the inserting portion of the second frame being inserted into the casing portion of the first frame to be telescopically extendable therefrom, the pivotal portion of the first frame being connected to the coupling member, the fixing portion of the second frame being connected to the fixing member; wherein the coupling member is slidingly coupled to the first of the pair of sliding members and the fixing member being affixedly coupled to one of (a) the fixing rail of a second of the sliding members or (b) one of the fixing posts of the pair of fixing posts secured to the second of the pair of sliding members for securing the fixing portion of the second frame in a fixed location with respect thereto; and wherein the coupling member is connected to a displaceable portion of the first of the pair of sliding members for displacement of the pivotal portion of the first frame of the supporting frame therewith independently of the cable management arm.

14. The cable management arm supporting device, as claimed in claim 13, wherein the fixing rail of each sliding member is connected to a respective bracket and each bracket being connected to a corresponding one of the fixing posts, the fixing member being connected to the bracket corresponding to the second of the pair of sliding members.

15. A cable management arm supporting device comprising an extendable supporting frame, a pair of sliding members secured to a plurality of supporting members and extendable with respect to the plurality supporting members, and a foldable cable management arm having one end thereof linked to one of the pair of sliding members for displacement therewith from a first position to a second position;

each of the pair of sliding members including a stationary fixing member coupled to a portion of the plurality of supporting members and at least one extendable member displaceably coupled to the fixing member, the one end of the cable management arm being coupled to the at least one extendable member of one of the pair of sliding members;

the cable management arm includes a first arm, a second arm, a movable portion, and a fixed portion, one end of the first arm being pivotally connected to one end of the second arm, another end of the first arm being connected to the movable portion and the movable portion being counted to the at least one extendable member of the one of the pair of sliding members, another end of the second arm being connected to the fixed portion and the fixed portion being coupled to another of the plurality of supporting members corresponding to the one of the pair of sliding members;

the supporting frame including at least a first frame and a second frame which are telescopically extendable with respect to each other, a coupling member, and a fixing member, the first frame having a pivotal portion and a casing portion at opposing ends thereof, the second frame having an inserting portion and a fixing portion at opposing ends thereof, the inserting portion of the second frame being inserted into the casing portion of the first frame, the pivotal portion of the first frame being connected to the coupling member, the fixing portion of the second frame being connected to the fixing member, the fixing member of the supporting frame being affixedly connected to one of the plurality of supporting members supporting the other of the pair of sliding members for securing the fixing portion of the second frame in a fixed location with respect thereto, the coupling member being linked to the extendable member to which the one end of the cable management arm is coupled, wherein when a loading object carried by the pair of sliding members moves, the coupling member of the supporting frame being moved by displacement of the extendable member and the supporting frame extends to support an intermediate portion of the cable management arm when the cable management arm is in the second position, the pivotal connection between the movable portion and the fixed portion of the cable management arm including a restricting member for limiting displacement of the cable management arm relative to the supporting frame in the first position.

16. The cable management arm supporting device, as claimed in claim 15, wherein a first shift member is provided between the first arm and the movable portion of the cable management arm, and a second shift member is provided between the second arm and the fixed portion.

17. The cable management arm supporting device, as claimed in claim 15, wherein the pivotal connection between the movable portion and the fixed portion includes an intermediate shelf provided between the first arm and the second arm of the cable management arm and pivotally coupled to the first and second arms on opposing ends thereof.

18. The cable management arm supporting device, as claimed in claim 17, wherein the restricting member extends from the intermediate shelf.

19. The cable management arm supporting device, as claimed in claim 8, wherein the coupling portion has an engaging section releasably engaged with the extension rail, the first sliding member having an actuating portion disposed on the fixing rail and positioned to contact the engaging section as the extension rail is displaced a certain distance, the actuating portion displacing the engaging section from engagement with the extension rail to release the coupling member therefrom and thereby limit displacement of the pivotal portion of the first frame relative to the displacement of the extension rail.

* * * * *